(12) United States Patent
Suzuki et al.

(10) Patent No.: US 9,946,472 B2
(45) Date of Patent: *Apr. 17, 2018

(54) SEMICONDUCTOR STORAGE DEVICE HAVING NONVOLATILE SEMICONDUCTOR MEMORY

(71) Applicant: Hitachi, Ltd., Tokyo (JP)

(72) Inventors: Akifumi Suzuki, Yohohama (JP); Takashi Tsunehiro, Ebina (JP)

(73) Assignee: HITACHI, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/048,500

(22) Filed: Feb. 19, 2016

(65) Prior Publication Data

US 2016/0170664 A1 Jun. 16, 2016

Related U.S. Application Data

(63) Continuation of application No. 13/500,057, filed as application No. PCT/JP2012/001530 on Mar. 6, 2012, now Pat. No. 9,299,455.

(51) Int. Cl.
| | |
|---|---|
| *G11C 29/02* | (2006.01) |
| *G11C 16/34* | (2006.01) |
| *G11C 16/00* | (2006.01) |
| *G06F 3/06* | (2006.01) |

(52) U.S. Cl.
CPC .......... *G06F 3/0616* (2013.01); *G06F 3/0629* (2013.01); *G06F 3/0679* (2013.01); *G11C 16/3431* (2013.01); *G11C 16/3495* (2013.01); *G11C 29/021* (2013.01); *G11C 29/028* (2013.01); *G11C 16/00* (2013.01)

(58) Field of Classification Search
CPC .... G06F 3/0616; G06F 3/0629; G06F 3/0679; G11C 16/3431; G11C 16/3495; G11C 29/021; G11C 29/028; G11C 29/00
See application file for complete search history.

(56) References Cited

U.S. PATENT DOCUMENTS

| | | | |
|---|---|---|---|
| 5,657,332 A | | 8/1997 | Auclair et al. |
| 5,978,941 A | * | 11/1999 | Katayama ............... G11C 16/14 714/718 |
| 6,151,246 A | | 11/2000 | So et al. |
| 6,223,311 B1 | * | 4/2001 | Katayama ........ G11C 29/50004 714/718 |
| 6,829,167 B2 | | 12/2004 | Tu et al. |
| 7,196,928 B2 | | 3/2007 | Chen |
| 7,333,364 B2 | | 2/2008 | Yu et al. |
| 7,716,538 B2 | | 5/2010 | Gonzalez et al. |

(Continued)

*Primary Examiner* — Reginald Bragdon
*Assistant Examiner* — Mehdi Namazi
(74) *Attorney, Agent, or Firm* — Foley & Lardner LLP

(57) ABSTRACT

A semiconductor storage device has a nonvolatile semiconductor memory comprised from multiple storage areas, and a controller, which is coupled to the nonvolatile semiconductor memory. The controller (A) identifies a storage area state, which is the state of a storage area, (B) decides, based on the storage area state identified in the (A), a read parameter, which is a parameter for use when reading data from a storage area with respect to a storage area of this storage area state, and (C) uses the read parameter decided in the (B) with respect to a read-target storage area and reads data from this read-target storage area.

10 Claims, 20 Drawing Sheets

(56) References Cited

U.S. PATENT DOCUMENTS

| | | |
|---|---|---|
| 7,916,547 B2 | 3/2011 | Hosono |
| 7,954,037 B2 | 5/2011 | Lasser et al. |
| 8,001,320 B2 | 8/2011 | Sokolov et al. |
| 8,949,555 B1 * | 2/2015 | Karamcheti ........ G06F 12/0246 711/158 |
| 9,299,455 B2 * | 3/2016 | Suzuki ................. G11C 29/028 |
| 2008/0037329 A1 * | 2/2008 | Takahashi .......... G11C 16/0475 365/185.21 |
| 2011/0044113 A1 * | 2/2011 | Kim .................... G11C 11/5628 365/185.19 |
| 2011/0066899 A1 | 3/2011 | Kang et al. |
| 2011/0066902 A1 | 3/2011 | Sharon et al. |
| 2012/0008414 A1 | 1/2012 | Katz et al. |
| 2012/0170379 A1 * | 7/2012 | Ahn .................... G11C 11/5642 365/185.25 |
| 2013/0111299 A1 | 5/2013 | Hashimoto et al. |
| 2013/0151753 A1 | 6/2013 | Jeon et al. |
| 2013/0159610 A1 | 6/2013 | Kawamura |
| 2013/0238836 A1 * | 9/2013 | Suzuki ............... G11C 16/3431 711/103 |

* cited by examiner

| LBA 501 | PBA 502 |
|---|---|
| 0x0000000000 | 0x35AB242000 |
| 0x0000001000 | 0x2B3A1D2000 |
| 0x0000002000 | Unallocated |
| 0x0000003000 | 0xDF20156000 |
| ~ | ~ |
| 0xFFFFFFD000 | Unallocated |
| 0xFFFFFFE000 | 0xAE00F04000 |

| 600 ↘ 601 | 602 | 603 | 604 | 605 | 606 |
|---|---|---|---|---|---|
| PBA Group | Chip number | Block number | No. of Erases | Last write Page | First Page Program date/time |
| 0x0000000000 | 0 | 0 | 1240 | 127 | 2011/01/06 9:00 |
| 0x0000100000 | 0 | 1 | 1245 | Not written | Not written |
| 0x0000200000 | 0 | 2 | 1202 | 127 | 2011/04/04 10:05 |
| 0x0000300000 | 0 | 3 | 1290 | 56 | 2011/04/05 9:00 |
| ∼ | ∼ | ∼ | ∼ | ∼ | ∼ |
| 0xFFFFE00000 | 255 | 4094 | 1243 | 96 | 2011/04/05 11:00 |
| 0xFFFFF00000 | 255 | 4095 | 1230 | 127 | 2011/02/16 15:00 |

| 801 | | No. of erases (times) | | | | |
|---|---|---|---|---|---|---|
| 802 Elapsed time since data recorded (days) | | 0 | 500 | 1000 | ~ | 10000 |
| | 0 | Read time =a [ms]<br>Level1 = b [V]<br>Level2 = c [V]<br>Level3 = d [V]<br>Changed Vpass =e[V]<br>Changed Vpass<br>WL= adjacent | Read time =a [ms]<br>Level1 = b [V]<br>Level2 = c [V]<br>Level3 = d [V]<br>Changed Vpass =e[V]<br>Changed Vpass<br>WL=adjacent | Read time =a [ms]<br>Level1 = b [V]<br>Level2 = c [V]<br>Level3 = d [V]<br>Changed Vpass =e[V]<br>Changed Vpass<br>WL=adjacent | ~ | Read time =f [ms]<br>Level1 = g [V]<br>Level2 = h [V]<br>Level3 = i [V]<br>Changed Vpass =e[V]<br>Changed Vpass<br>WL=adjacent |
| | 1 | Read time =a [ms]<br>Level1 = b [V]<br>Level2 = c [V]<br>Level3 = d [V]<br>Changed Vpass =e[V]<br>Changed Vpass<br>WL=adjacent | Read time =a [ms]<br>Level1 = b [V]<br>Level2 = c [V]<br>Level3 = d [V]<br>Changed Vpass =e[V]<br>Changed Vpass<br>WL=adjacent | Read time =f [ms]<br>Level1 = g [V]<br>Level2 = h [V]<br>Level3 = i [V]<br>Changed Vpass =j[V]<br>Changed Vpass<br>WL= all | ~ | Read time =f [ms]<br>Level1 = g [V]<br>Level2 = h [V]<br>Level3 = i [V]<br>Changed Vpass =j[V]<br>Changed Vpass<br>WL= all |
| | ~ | | | | | |
| | 365 | Read time =k [ms]<br>Level1 = l [V]<br>Level2 = m [V]<br>Level3 = n [V]<br>Changed Vpass = o [V]<br>Changed Vpass<br>WL= all | Read time = k [ms]<br>Level1 = l [V]<br>Level2 = m [V]<br>Level3 = n [V]<br>Changed Vpass =o [V]<br>Changed Vpass<br>WL= all | Read time =k [ms]<br>Level1 = l [V]<br>Level2 = m [V]<br>Level3 = n [V]<br>Changed Vpass = o [V]<br>Changed Vpass<br>WL= all | ~ | Read time =p [ms]<br>Level1 = q [V]<br>Level2 = r [V]<br>Level3 = s [V]<br>Changed Vpass = t [V]<br>Changed Vpass<br>WL=all |

| 601 | 602 | 603 | 604 | 605 | 606 | 1107 | 1108 |
|---|---|---|---|---|---|---|---|
| PBA Group | Chip number | Block number | No. of Erases | Last write Page | First Page Program date/time | Read Parameter | Degree of deterioration |
| 0x0000000000 | 0 | 0 | 1240 | 127 | 2011/01/06 9:00 | Parameter A | 1350 |
| 0x0000100000 | 0 | 1 | 1245 | Not written | Not written | - | 1600 |
| 0x0000200000 | 0 | 2 | 1202 | 127 | 2011/04/04 10:05 | Normal | 800 |
| 0x0000300000 | 0 | 3 | 1290 | 56 | 2011/04/05 9:00 | Normal | 1250 |
| ~ | ~ | ~ | ~ | ~ | ~ | ~ | ~ |
| 0xFFFFE00000 | 255 | 4094 | 1243 | 96 | 2011/04/05 11:00 | Parameter B | 1400 |
| 0xFFFFF00000 | 255 | 4095 | 1230 | 127 | 2011/02/16 15:00 | Parameter A | 1230 |

SEMICONDUCTOR STORAGE DEVICE HAVING NONVOLATILE SEMICONDUCTOR MEMORY

CROSS-REFERENCE TO RELATED PATENT APPLICATIONS

This application is a Continuation of U.S. application Ser. No. 13/500,057 filed Apr. 3, 2012 (National Stage of PCT/JP2012/001530 filed Apr. 3, 2012), which is now U.S. Pat. No. 9,299,455. All of the aforesaid applications are incorporated herein by reference in their entirety.

TECHNICAL FIELD

The present invention relates to reading data from an electrically rewritable nonvolatile semiconductor memory.

BACKGROUND ART

Flash memory is generally well-known as an example of a nonvolatile semiconductor memory. One example of a semiconductor storage device comprising flash memory is the SSD (Solid State Drive). An SSD is advantageous compared to a HDD (Hard Disk Drive) in that it features higher read and write processing performance.

A flash memory comprises multiple cells, and a single cell, for example, maintains two states over time. More specifically, digital data is recorded by associating one of the two states of the cell with the bit value "1", and the other of the two states with the bit value "0". For example, in the case of a SLC (Single Level Cell) type flash memory, which is an example of a semiconductor recording element, digital data is recorded by associating a state in which an electron is injected onto a FG (Floating Gate) of the cell with the bit value "0" and associating a state in which an electron is not injected onto the cell FG with the bit value "1", and maintaining this state over time.

The downscaling of flash memory circuits has made progress in recent years, and as this downscaling has progressed, recorded data storage capabilities of a flash memory have dwindled. The reason for this is that the difference between an injected electron state and a non-injected electron state is narrowed by downscaling, and when a flash memory is being read, this increases the probability of a cell, which would have been originally determined to be injected with an electron, being erroneously judged to be a cell, which has not been injected with an electron, and, alternatively, increases the probability of a cell, which would have been originally determined not to be injected with an electron, being erroneously judged to be a cell, which has been injected with an electron. For this reason, fail bits (a bit associated with a cell for which the state was erroneously determined to be different), which are included in read data from a flash memory, have increased in recent years, increasing the likelihood of the correction capabilities of the correction codes assigned to data being overwhelmed and data being lost. The increase in the number of fail bits is more conspicuously apparent as a result of the progress of cell deterioration in accordance with cell rewriting. For this reason, the number of erases possible in a flash memory is decreasing in accordance with advances in downscaling.

Data is read from a flash memory using one or more prescribed types of parameters. A parameter, which is used in a data read, will be called a "read parameter" hereinbelow.

When a read parameter is inappropriate, a large number of fail bits occur in the read data. For example, a flash memory generally corrects a fail bit in read data by using a correction code such as ECC, but when a read parameter is inappropriate, the probability of the read data having a larger number of fail bits than the number of fail bits allowed increases. This makes it impossible to correct the read data.

Consequently, a technology for changing a read parameter and using the post-change read parameter to read data from a flash memory is known. Hereinafter, using an unchanged prescribed read parameter to read data will be referred to as a "normal read", and changing a read parameter and using the post-change read parameter to read data will be referred to as a "special read".

Technology for performing a special read includes the technology disclosed in Patent Literature 1. Patent Literature 1 discloses a technology for changing a reference voltage at the time of a read (a read voltage) for determining the presence or absence of an injected electron in a cell, and discloses two examples of a method for changing the reference voltage. One example is a method in which a flash memory controller notifies a flash memory of a change in the read reference voltage value and this changed value, and the flash memory internally changes the read reference voltage. The other example is a method in which, in a case where the configuration is such that the flash memory controller creates a read voltage and supplies this read voltage to the flash memory at the time of a read, the flash memory controller supplies this read voltage by changing the read reference voltage. Patent Literature 1 discloses technology for changing the read reference voltage in various ways in an attempt to reduce the fail bits when the number of fail bits occurring in read data at the time of a read exceeds that which could be corrected by the correction code (ECC: Error Correcting Code) assigned to the data, making it impossible to read the data accurately.

CITATION LIST

Patent Literature

[PTL 1]
U.S. Pat. No. 5,657,332

SUMMARY OF INVENTION

Technical Problem

The bit cost of the SSD is generally higher than that of the HDD. However, the SSD is advantageous compared to the HDD in that it features high read/write processing performance. In the technology disclosed in Patent Literature 1, when a normal read fails, a special read, which changes the read parameter to various values, is repeated until a read becomes possible. Read processing performance is greatly diminished as a result. This dramatic decrease in read processing performance severely impairs the merits of the SSD.

Furthermore, since a flash memory block tends to deteriorate as the number of erases (number of rewrites) increases, it becomes difficult to record and retain data when the number of erases increases. More specifically, for example, when a block deteriorates, the number of fail bits included in the data stored in this block is numerous even after a short period of time. As block deterioration progresses, for example, the rate of increase in the number of fail bits in this block increases.

For this reason, the SSD performs control (called wear leveling) to equalize the number of erases for each block of the flash memory for the purpose of preventing a specific block from becoming unusable due to a concentration of rewrites to this block. However, the level of deterioration will differ by block even when the number of erases is the same as a result of variations in inherent quality and variations in acquired states of utilization, such as a rewrite interval.

Problems like those cited above are also possible with a nonvolatile semiconductor memory other than flash memory.

Solution to Problem

A semiconductor storage device comprises a nonvolatile semiconductor memory comprised of multiple storage areas, and a controller coupled to the nonvolatile semiconductor memory. The controller (A) identifies a storage area state, which is the state of a storage area, (B) decides, based on the storage area state identified in (A) above, a read parameter, which is a parameter for use when reading data from the storage area with respect to a storage area of this storage area state, and (C) uses the read parameter decided in (B) above with respect to a read-target storage area to read data from this read-target storage area. The above-mentioned (A) and (B) may be performed at the time of a read process for data from the storage area, or may be performed beforehand asynchronously with this read process. In a case where the nonvolatile semiconductor memory is a flash memory, the above-mentioned storage area may be respective groups of FM chips (for example, a DIMM (Dual Inline Memory Module), which comprises two or more FM chips) of multiple flash FM chips (hereinafter, FM chip), may be respective FM chips, may be respective blocks in an FM chip, may be respective pages in a block, or may be respective sectors in a page.

BRIEF DESCRIPTION OF DRAWINGS

FIG. 5 is a diagram showing an example of an address translation table related to Example 1.

FIG. 6 is a diagram showing an example of a block management table related to Example 1.

FIG. 8 is a diagram showing an example of read parameter management table related to Example 1.

FIG. 11 is a diagram showing an example of a block management table related to Example 2.

DESCRIPTION OF EMBODIMENTS

Figure 1:
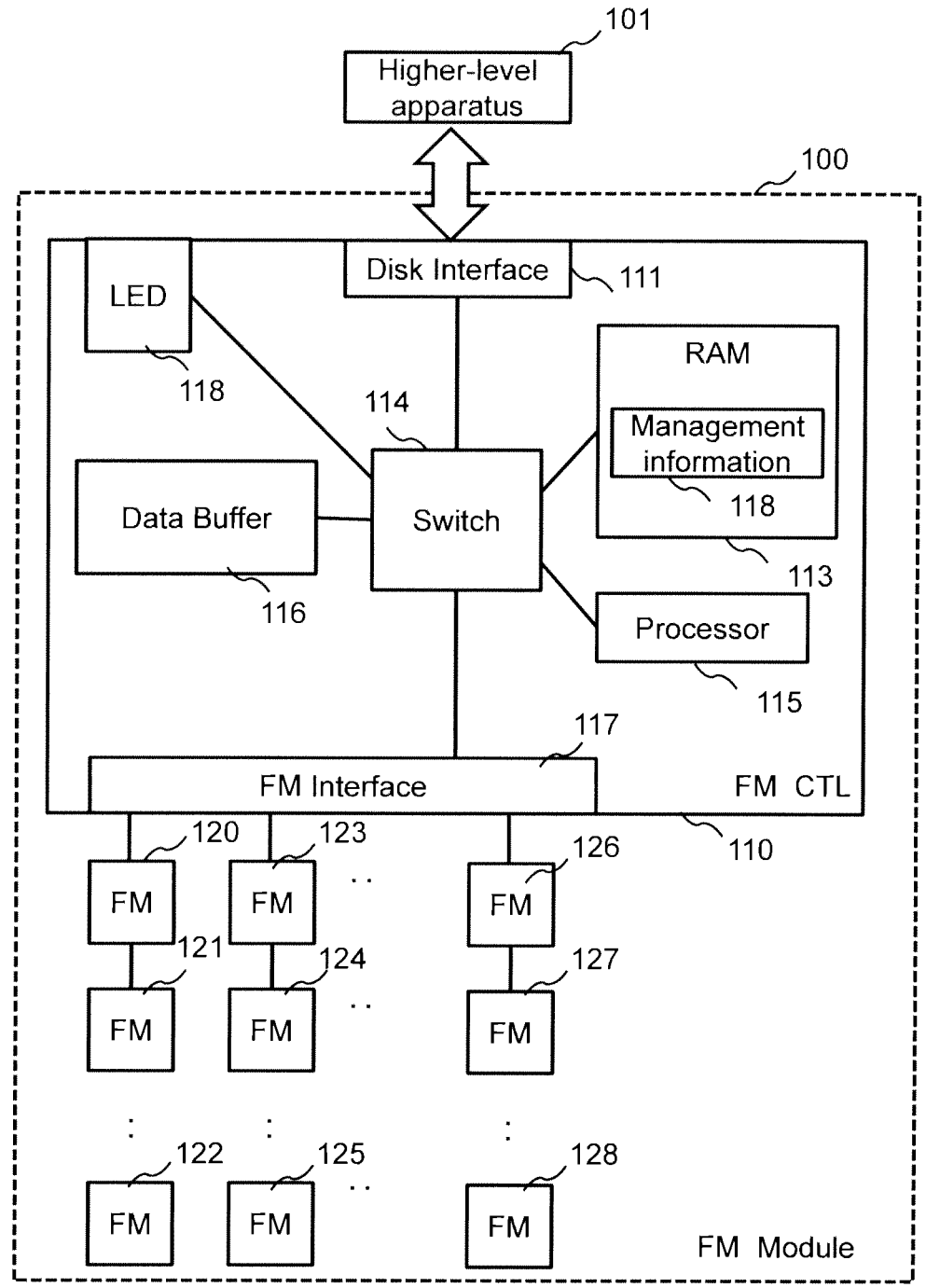
FIG. 1 is a detailed block diagram of a computer system related to Example 1.

A number of examples will be explained below by referring to the drawings.

Furthermore, in the following explanation, various types of information may be explained using the expression "aaa table", but the various information may also be expressed using a data structure other than a table. To show that the various information is not dependent on the data structure, "aaa table" can be called "aaa information".

In the following explanation, identification information comprising a number will be used to identify an element (for example, a page, a flash FM chip (FM chip), a block, a word line (WL), and so forth), but information, which does not comprise a number, may be used as the identification information.

In the following explanation, it is supposed that a nonvolatile semiconductor memory is a flash memory (FM). It is supposed that this flash memory is a typical NAND-type flash memory, i.e. a type of flash memory in which an erase is performed in units of blocks, and an access is performed in units of pages. However, the flash memory may be another type of flash memory (for example, a NOR type) instead of a NAND type. In addition, another type of nonvolatile semiconductor memory, for example, a phase-change memory may be used instead of a flash memory.

In the following explanation, at least a part of the processing performed by a controller (for example, at least one of a flash memory controller and a RAID controller, which will be explained further below) is performed in accordance with a processor (for example, a CPU (Central Processing Unit)) executing a computer program. The controller may be the CPU itself, or may comprise a hardware circuit, which performs either all or part of the processing performed by the processor. A program may be installed in each controller from a program source. The program source, for example, may be a program delivery server or a storage medium.

All of the examples described hereinbelow conform to the following aspect. A read parameter, which is used at the time of a special read, is decided on the basis of the state of the read-target storage area of the special read. There is a high likelihood that the read parameter decided in this way will be appropriate, and, as such, there is a low likelihood of the read data comprising fail bits exceeding the number of fail bits allowed. For this reason, all of the examples are promising for repeating a special read (and reducing the number of these repetitions) for the same read-target storage area until correctable data can be read.

The state of the flash memory cell here changes in accordance with multiple factors, such as the ambient temperature to which the flash memory is exposed, the time that elapses after data is initially programmed subsequent to an erase, the cumulative number of erases of a storage area (set of cells), and the storage area rewrite interval. For this reason, for example, just because the number of fail bits included in data read is equal to or less than the number of allowed fail bits in accordance with having used a certain read parameter in the previous special read does not mean that the number of fail bits included in read data read will be equal to or less than the number of allowed fail bits when the read parameter is used in the next and subsequent special reads. All of the examples described hereinbelow also take this fact into account.

An evaluation value based on the accuracy of data recorded in a storage area (the quantity of the number of fail bits included in recorded data immediately after a write) and post-data recording maintainability over time (the size of the rate of increase in the number of fail bits over time subsequent to recording data) is more preferable as an evaluation value for showing the degree of deterioration of the flash memory cell than the number of erases, and it is preferable that equalization be performed using this evaluation value as the equalization of the degree of deterioration of the flash memory storage area.

Furthermore, it is preferable that a determination with respect to refreshing the flash memory be made on the basis of the storage state of the storage area (for example, the data loss probability).

Example 1

First, a computer system related to Example 1 will be explained.

(1-1) Computer System Configuration

FIG. 1 is a detailed block diagram of a computer system related to Example 1.

A flash memory module 100, which serves as an example of a semiconductor storage device in the computer system, is coupled to a higher-level apparatus 101.

The higher-level apparatus 101, for example, is equivalent to a computer or a file server, which forms the core of a business system, or a storage system to which a large number of storage apparatuses are coupled. The higher-level apparatus 101 comprises hardware resources, such as a processor, a memory, a network interface, and a local input/output device(s), and comprises software resources, such as a device driver(s), an operating system (OS), and an application program(s). The higher-level apparatus 101 communicates with the flash memory module 100 and performs read/write requests with respect to the flash memory module 100 in accordance with executing various types of programs under processor control. The higher-level apparatus 101 acquires management information, such as the utilization status, operating status, and so forth of the flash memory module 100 in accordance with executing a management program under processor control. The higher-level apparatus 101 can also receive various types of settings from an administrator, and change various types of settings with respect to the flash memory module 100.

The flash memory module 100 comprises a flash memory controller (FM CTL) 110, and multiple (for example, 32) flash memory chips (referred to as FM chips hereinafter) 120 through 128.

The flash memory controller 110 comprises a processor 115, a RAM 113, a data buffer 116, a disk interface 111, a flash memory interface 117, a LED (Light Emitting Diode) 118, and a switch 114.

The switch 114 is reciprocally coupled to each part of the flash memory controller 110 (the processor 115, the RAM 113, the data buffer 116, the disk interface 111, the flash memory interface 117, and the LED 118), and transfers data among the respective parts by routing this data using an address or a ID.

The disk interface 111 is coupled to the higher-level apparatus 101, and relays communications with the higher-level apparatus 101. The disk interface 111 receives from the higher-level apparatus 101 a read and/or a write request and a LBA (Logical Block Address) specifying a logical storage location of a request target, and, in the case of a write request, write data. The disk interface 111 receives a control command or the like with respect to the flash memory module 100, and, in accordance with this control command, notifies the higher-level apparatus 101 of the operation status, the utilization status, and the current setting values of the flash memory module 100.

The processor 115 controls the entire flash memory controller 110 on the basis of a program and management information 118 stored in the RAM 113. In addition, the processor 115 monitors the entire flash memory module 110 in accordance with an interrupt receiving function and the regular acquisition of information. The specific processing of the processor 115 will be explained further below.

The data buffer 116 stores temporary data midway through a data transfer process by the flash memory controller 110. The flash memory interface 117 is coupled to the respective FM chips 120 through 128 via multiple buses (for example, 16). Multiple (for example, two) FM chips (120 and so forth) are coupled to each bus. The flash memory interface 117 is coupled to the respective FM chips 120 through 128 via a CE (Chip Enable) signal line. The flash memory interface 117 uses a CE signal to independently control the multiple FM chips 120 and so forth, which are coupled to the same bus.

The flash memory interface 117 operates in accordance with a read/write request instructed from the processor 115. The flash memory interface 117 is instructed at this time using a request-target physical address (PBA: Physical Block Address). The flash memory interface 117, upon receiving the PBA, computes the request-target FM chip, block, and page from the PBA, and performs a read/write request, which specifies a block and a page with respect to the request-target FM chip.

The flash memory interface 117, at the time of a read operation, reads stored data from the FM chips 120 through 128 and transfers this data to the data buffer 116, and at the time of a write operation, invokes the write-data (write data) from the data buffer 116, and writes this data to the FM chips 120 through 128.

In addition, the flash memory interface 117 comprises an ECC creation circuit, an ECC-based data loss detection circuit, and an ECC correction circuit. The flash memory interface 117, at the time of a write operation, uses the ECC creation circuit to create an ECC for appending to the write-data, appends the created ECC to the write-data, and writes the ECC-appended write-data to the FM chip. The flash memory interface 117, at the time of a data read, uses the ECC-based data loss detection circuit to check data read from the FM chip, and when a data loss is detected, uses the ECC correction circuit to correct the data and to store the number of corrected bits in the RAM 113 in order to notify the processor 115 of the number of corrected bits.

In Example 1, the flash memory interface 117 comprises a function for acquiring an ambient temperature of a relevant chip from a temperature sensor attached to each of the FM chips 120 through 128. The flash memory interface 117 notifies the processor 115 of the ambient temperature of each chip in response to a temperature acquisition request from the processor 115.

The LED 118 performs a light-emitting operation in accordance with an instruction from the processor 115. In Example 1, light is emitted in accordance with the state of the flash memory module 100.

The RAM 113, for example, may be a volatile memory like a DRAM. The RAM 113 stores management information 118 for the FM chips 120 through 128 comprising the flash memory module 100, and various types of programs for execution by the processor 115. The RAM 113 may comprise either all or part of the functions of the data buffer 116 for storing data, and may be used for data storage. The management information 118, for example, includes an address translation table 500, a block management table 600, an ambient temperature management table 700, and a read parameter management table 800. These tables will be explained further below.

In Example 1, the switch 114, the disk interface 111, the processor 115, the RAM 113, the data buffer 116, the flash memory interface 117, and the LED 118 may be configured as a single semiconductor element, such as an ASIC (Application Specific Integrated Circuit) or a FPGA (Field Programmable Gate Array), or may be a configuration reciprocally coupling multiple ICs (Integrated Circuits).

The flash memory module 100, for example, may comprise a storage device of a storage system 10 (refer to FIG. 20) in the computer system.

Next, an FM chip will be explained.

Figure 2:
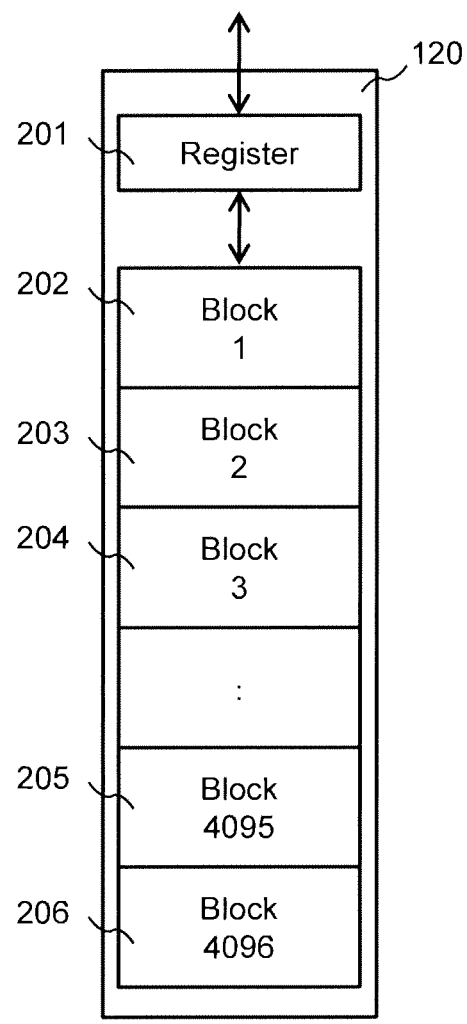
FIG. 2 is a schematic block diagram of a FM chip related to Example 1.

FIG. 2 is a schematic block diagram of a FM chip related to Example 1. An explanation will be given here by describing FM chip 120, but the other FM chips 121 through 128 constitute the same configuration.

The FM chip 120 comprises a storage area comprising multiple (for example, 4096) blocks 202 through 206. In the FM chip 120, a data erase is only possible in units of blocks. Multiple pages can be stored in each block. The FM chip 120 also comprises a I/O register 201. The I/O register 201 has a capacity of equal to or larger than the size of a page (for example, 4 KB+a spare area for an appended ECC). The FM chip 120 operates in conformance to a read/write request instruction from the flash memory interface 117. At the time of a write operation, first of all, the FM chip 120 receives a write command, a request-target block, a page number, and an in-page program start location from the flash memory interface 117. Next, the FM chip 120 stores the write-data transferred from the flash memory interface 117 in the I/O register 201 in order from the address corresponding to the program start location of the page. Thereafter, the FM chip 120 receives a data transfer complete command, and, in addition, writes the data stored in the I/O register 201 to the specified page.

At the time of a read operation, first of all, the FM chip 120 receives a read command, a request-target block, and a page number from the flash memory interface 117. Next, the FM chip 120 reads data stored in the page(s) of the specified block, and stores this data in the I/O register 201. Thereafter, the FM chip 120 transfers the data, which has been stored in the I/O register 201, to the flash memory interface 117. In Example 1, in a case where a read parameter is received prior to receiving a read command, the FM chip 120 executes the read processing for the data stored in the page(s) of the specified block in accordance with the read parameter.

Next, a block of the FM chip will be explained.

Figure 3:
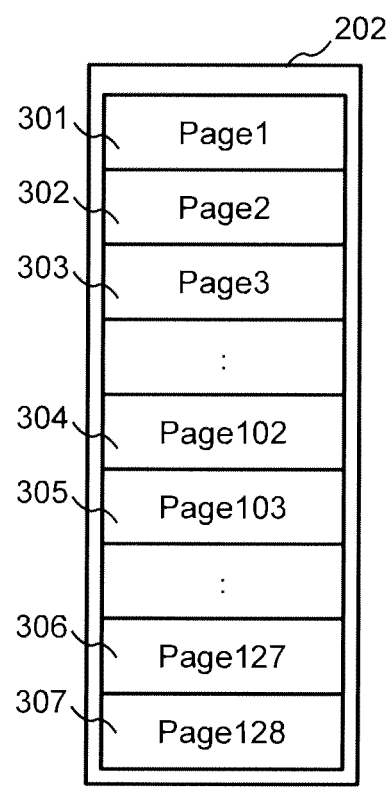
FIG. 3 is a schematic block diagram of a block of an FM chip related to Example 1.

FIG. 3 is a schematic block diagram of a FM chip block related to Example 1. An explanation will be given here by describing the block 202, but the other blocks 203 through 206 constitute the same configuration.

The block 202 is partitioned into multiple (for example, 128) pages 301 through 307. In the block 202, a stored data read or a data write can only be processed in units of pages. A sequence for writing to the pages 301 through 307 inside the block 202 is stipulated as the sequence starting from the first page of the block, that is, in the order of page 301, 302, 303 and so forth. Furthermore, the overwriting of a written page in this block 202 is prohibited, and the relevant page can only be written to once again when the entire block to which the relevant page belongs has been erased. For this reason, the flash memory module 100 related to Example 1 manages the logical address (logical block address: LBA) specified by the higher-level apparatus 101 and the address (physical block address: PBA), which specifies the physical storage area inside the flash memory module 100, as different address architectures, and manages information denoting the association of the LBA and the PBA as a table (the address translation table 500).

For example, at the time of an update write to the LBA, the processor 115 changes the PBA associated with the LBA to a new PBA denoting a different page prior to the update and writes the write-data corresponding to the LBA to a page in a different area of the FM chip. An address change such as this makes it possible to conceal the changing of the actual physical storage area from the higher-level apparatus 101. The PBA is an address architecture, which can uniquely specify an arbitrary page in the flash memory module 100, and in which a series of addresses are listed in page number order within a range of at least one block's worth of data sizes. For example, incrementing the data size by one page with respect to a PBA, which specifies the third page of a certain block, results in a PBA specifying the fourth page.

Next, a page inside a block will be explained.

Figure 4:
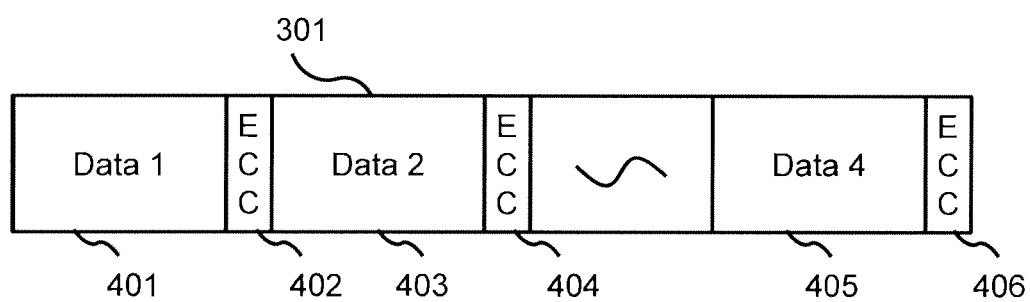
FIG. 4 is a block diagram of the inside of a page related to Example 1.

FIG. 4 is an internal block diagram of a page related to Example 1. An explanation will be given here by describing page 301, but the other pages 302 through 307 constitute the same configuration.

The page 301 stores a fixed number of bits (for example, 4 KB) of data 401, 403, 405, and so forth. In addition to the data 401, 403, 405, and so forth, the page 301 also stores ECCs 402, 404, 406, and so forth, appended to the respective data by the flash memory interface 117. Each ECC 402, 404, 406, and so forth, is stored adjacent to data which is to be protected (that is, data targeted for error correction: called protected data). That is, a combination of a piece of data and a corresponding ECC are stored as a single set (ECC CW: ECC CodeWord). In this drawing, the data 401 and the ECC 402 are stored as a set, the data 403 and the ECC 404 are stored as a set, and the data 405 and the ECC 406 are stored as a set. Furthermore, this drawing denotes a configuration in which four ECC CWs are stored for one page, but an arbitrary number of ECC CW may be stored in accordance with the page size, and the strength of the ECC (the number of bits capable of being corrected). Here, a data loss failure is a phenomenon, which occurs when the number of fail bits per ECC CW exceeds the number of bits, which could be corrected by the ECC comprising this ECC CW.

Next, a cell of a FM chip will be explained.

Figure 19:
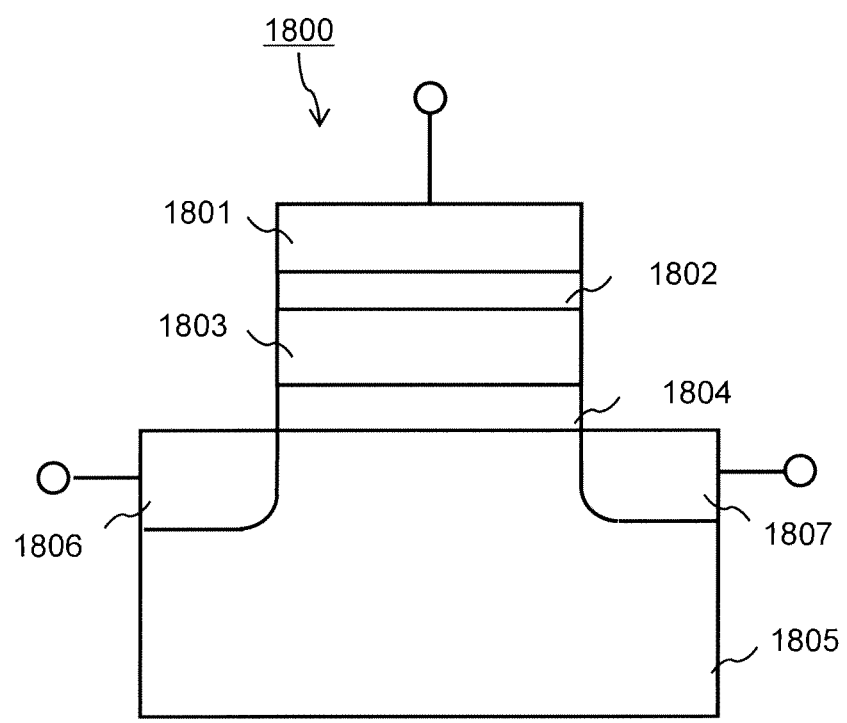
FIG. 19 is a block diagram of a flash memory cell.

FIG. 19 is a block diagram of an FM chip cell.

The cell 1800 of the FM chip 120 shown in this drawing is a configuration, which adds a floating gate 1803 to a MOS-type transistor. That is, the flash memory cell 1800 comprises a control gate 1801, an insulating layer 1802, a floating gate 1803, a tunneling insulating layer 1804, a p-well 1805, a source 1806 and a drain 1807. The flash memory cell 1800 changes the conductance between the source and the drain in accordance with a voltage applied to the control gate 1801 and the amount of electrons injected onto the floating gate 1803. In other words, a cell threshold voltage, that is, the voltage applied to the control gate 1801, which is required for an electric current to flow between the source and the drain, changes in accordance with the amount of electrons injected onto the floating gate 1803. For example, in an MLC (Multiple Level Cell)-type FM chip, the amount of electrons injected onto the floating gate 1803 is controlled when recording data. In the MLC-type of FM chip, when reading data, multiple voltages are applied to the control gate 1801, and the amount of electrons injected onto the floating gate 1803 is estimated on the basis of the voltage of the control gate 1801 when the electric current is flowing between the source and the drain.

Next, the operating principle of the FM chip will be explained.

Figure 16:
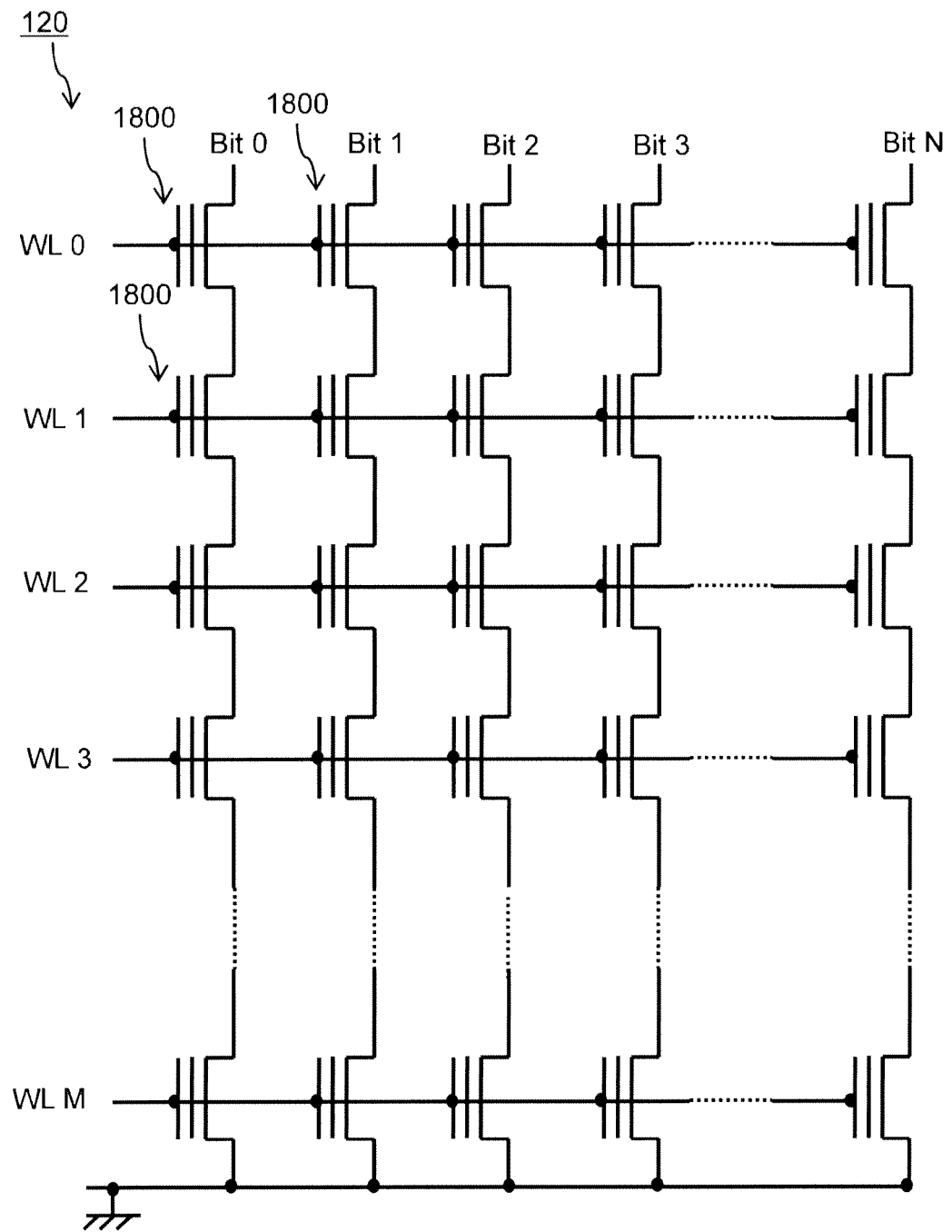
FIG. 16 is a schematic block diagram of a cell of a NAND-type flash FM chip.
Figure 17:
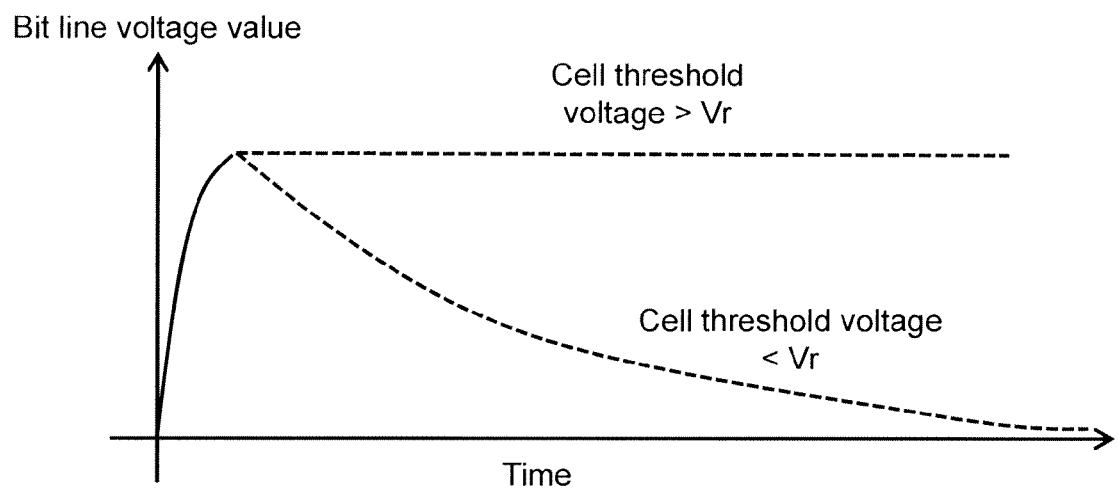
FIG. 17 is a diagram showing a Bit line voltage value when reading from a FM chip cell.

FIG. 16 is a schematic block diagram of the cell of a NAND-type flash FM chip. FIG. 17 is a diagram showing a Bit line voltage value when reading from a FM chip cell.

The NAND-type flash FM chip 120, as shown in FIG. 16, is a configuration in which multiple flash memory cells 1800 are arranged in an array. In this drawing, for the sake of simplicity, cells 1800 for recording data are shown, but the select gate and other such parts of the configuration have been omitted.

In the FM chip 120, a word line (WL0 through WLM) is coupled to the control gate 1801 of each cell 1800, and a source 1806 and a drain 1807 are linked to each Bit line (Bit 0 through Bit N).

In the FM chip 120, at the time of a data read, data recorded in the cells 1800 coupled to the same word line is read. An example in which the data of the cell 1800 coupled to the WL 2 in this drawing will be explained here. The FM chip 120 applies a voltage (a pass voltage: Vpass) so that the cells 1800 coupled to all of the WL (non-select lines) of the same block, with the exception of WL 2 (the select line), transition to a conductive state. Since each cell 1800 coupled to a non-select line to which a Vpass is being applied transitions to the conductive state when a voltage (a read voltage) is applied at this time for reading the respective Bit lines, the Bit line voltage value changes in accordance with the state of the cell 1800 coupled to the WL 2, which is the select line. More specifically, as indicated by the dashed lines in FIG. 17, when the threshold voltage of the cell 1800 coupled to the WL 2 is smaller than the read voltage (Vr), electric current flows between the source and the drain of the cell 1800, and the Bit line voltage diminishes over time. Alternatively, when the threshold voltage of the cell 1800 is larger than the read voltage (Vr), an insulating state forms between the source and the drain of the cell 1800, and the Bit line voltage becomes fixed with respect to time.

For this reason, it is possible to determine whether the threshold voltage of each cell 1800 coupled to a select line is larger or smaller than the read voltage in accordance with acquiring the voltage state of each Bit line subsequent to the passage of a prescribed period of time (a read time) after applying a read voltage to the Bit line. At this time, for example, in the case of a FM chip 120 in which the recording value of a cell for which the threshold voltage is smaller than the read voltage (Vr) is associated with "1", and the recording value of a cell for which the threshold voltage is larger than the read voltage (Vr) is associated with "0", it becomes possible to read digital data stored in the FM chip 120 by replacing the voltage state of each Bit line with a Bit value.

Next, the generation of a fail bit, which occurs in read data, will be explained.

Figure 18:
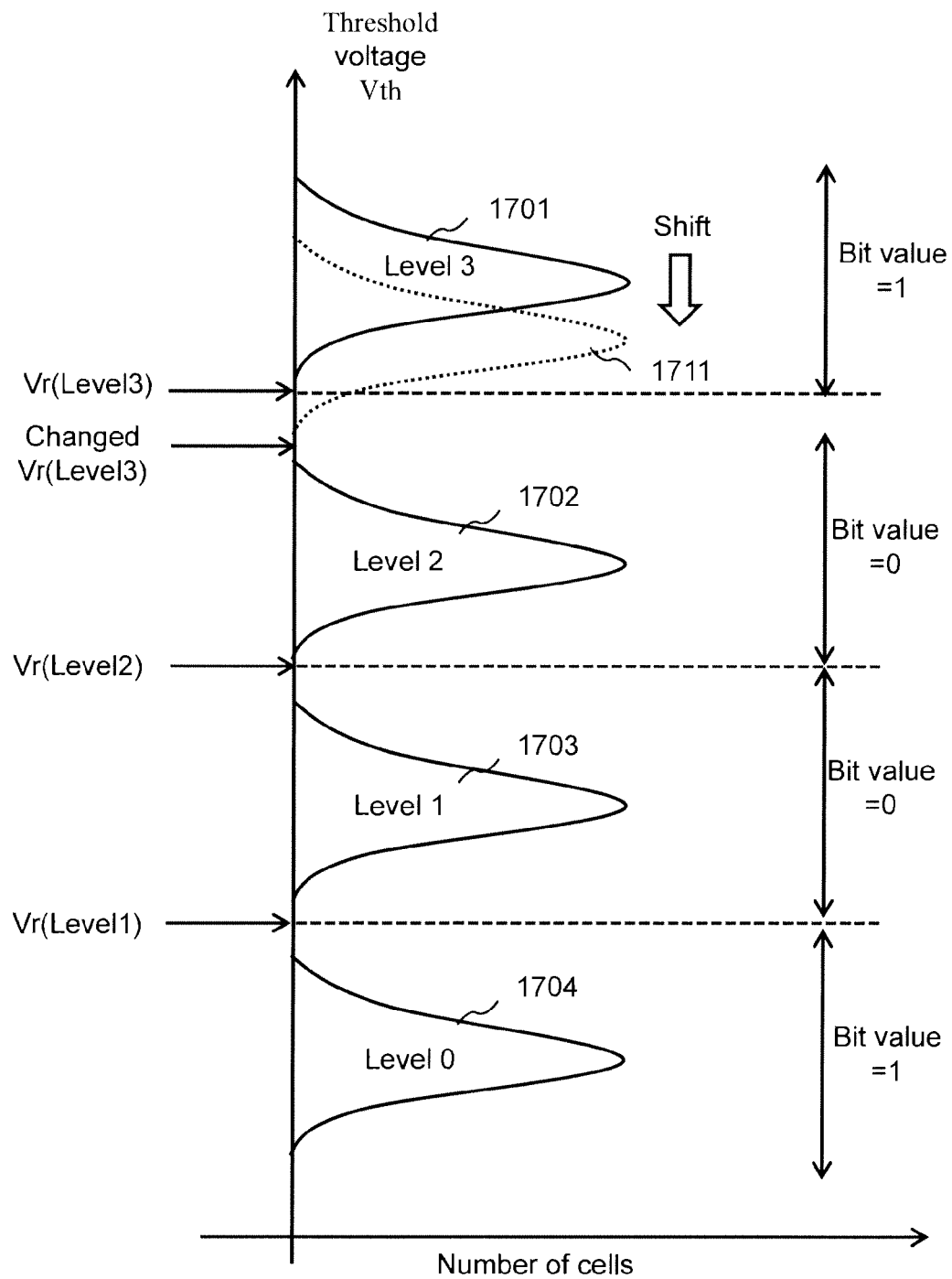
FIG. 18 is a diagram schematically showing a threshold distribution of a MLC-type flash memory cell.

FIG. 18 is a diagram schematically showing a threshold distribution of a MLC-type flash memory cell. This drawing is an example of a flash memory cell capable of storing data of four values, and it is supposed that threshold voltage distribution groups (1701, 1702, 1703, 1704) beginning from the lowest voltage are Level 0, Level 1, Level 2, and Level 3. In addition, it is supposed that the read voltages for determining each threshold voltage distribution group of the cell are Vr (Level 1), Vr (Level 2) and Vr (Level 3), respectively.

The read voltages here are voltages applied to the control gate 1801 of the cell 1800 at the time of a read. In the FM chip 120, the size of the cell 1800 threshold voltage is determined by comparing the threshold voltage to the read voltage. For example, to make a determination about the threshold voltage distribution group Level 2 of the cell 1800, after applying the Vr (Level 1) to the control gate 1801 and confirming that the voltage applied to the Bit line remains constant, the Vr (Level 2) is applied to the control gate 1801 and the fact that the voltage applied to the Bit line drops is confirmed. In an FM chip, since it is not possible to completely control the amount of electrons, which are injected onto the floating gate 1803 at the time of a data write (at programming), individual variations will occur in the distribution groups (1701 through 1704) of the threshold voltages actually created in the cell groups programmed having the same threshold voltage as a target. For this reason, in a MLC-type FM chip for which there are multiple threshold voltages, a fixed range of each threshold voltage distribution group is associated with a Bit value as shown in FIG. 18.

As an example of the occurrence of a fail bit, a case, in which the threshold voltage distribution group 1702 of a group of cells programmed so as to become equal to or larger than read voltage Vr (Level 3) shown in FIG. 18 is changed so that the entire threshold voltage distribution drops over time as indicated by threshold voltage distribution group 1711, will be explained here. A fail bit occurs in a case where the threshold voltage distribution group is shifted either up or down, and may also occur in a case where the threshold voltage distribution group rises over time, or a case where the threshold voltage distribution group rises immediately after programming. The insulation capabilities of the tunneling insulating layer 1804 of the flash memory cell diminish in accordance with repeated rewrites. The drop in the insulation capabilities of the tunneling insulating layer 1804 makes the electrons stored on the floating gate 1803 susceptible to ejection. For this reason, the electrons stored on the floating gate 1803 of a deteriorated flash memory cell 1800 decrease with the passage of time, and the cell threshold voltage is also lowered over time.

For example, in a cell group in which the threshold voltage distribution group 1711 has dropped as shown in the drawing, since the current flows along the Bit line and the Bit line voltage drops as described hereinabove in a portion of the cells for which the threshold voltage drops below the read voltage Vr (Level 3) when the read voltage Vr (Level 3) is applied to the select line at the time of a read, it is determined that the cell belongs to the Level 2 threshold voltage distribution group. This is what causes a fail bit to occur.

Thus, in a case where a fail bit has occurred in accordance with the threshold voltage created at programming time differing from the threshold voltage at read time, and this fail bit exceeds the correction capabilities of the ECC assigned to the data, it becomes impossible to correct the read data. That is, it becomes impossible to read the data normally.

As a method for solving this event, a method for changing the read voltage is known. Specifically, as shown in FIG. 18, the read voltage Vr (Level 3) is changed in accordance with the direction of change of the threshold voltage. According to this read voltage change, it is possible, using the post-change read voltage (Changed Vr (Level 3)), to determine that the cell, for which a threshold voltage distribution group 1702 of Level 2 was determined using the pre-change read voltage (Vr (Level 3)), is Level 3, which is the original threshold voltage distribution group.

By contrast, it is also conceivable that a cell, which should be determined as threshold voltage distribution group Level 2 in accordance with the read voltage Vr (Level 3) approaching the threshold voltage distribution group Level 2, is mistakenly determined to be threshold voltage distribution group Level 3 here, increasing the fail bits. However, in accordance with changing the read voltage Vr (Level 3), the number of fail bits included in data can be decreased when the amount of decrease in the number of fail bits of the threshold voltage distribution group Level 3 exceeds the amount of increase in the number of fail bits of threshold voltage distribution group Level 2. The read voltage, which is able to decrease the number of fail bits the most here is the optimum read voltage for this storage area. Due to the fact that the cell threshold distribution group dynamically changes in accordance with the degree of cell deterioration, the elapsed time, and the utilization environment, the optimum read voltage will change in various ways in accordance with the storage area utilization condition(s). In Example 1, a read parameter is managed by a read parameter management table 800 to make it possible to imitate such a change in the optimum read voltage for each cell and to use the optimum read voltage for the state of an individual cell.

As shown in FIG. 17, when the cell threshold voltage is smaller than the read voltage, the Bit line voltage gradually drops over time. In addition, since the amount of current flowing between the cell source and drain decreases the closer the read voltage and the threshold voltage are to one another, the time until the Bit line voltage drops sufficiently is prolonged. Hypothetically, in a case where the time for measuring the voltage drop in the Bit line is short and a determination is made about the cell threshold voltage prior to the voltage having dropped sufficiently, there is the likelihood of the cell threshold voltage determination being in error. Alternatively, in a case where sufficient time for measuring the Bit line voltage drop is ensured for all sorts of conditions, read time increases and flash memory module performance decreases. For this reason, it is preferable that the optimum value of the time for waiting for the Bit line voltage drop be the shortest time in which data can be accurately read. In Example 1, the time spent waiting for the voltage drop is made appropriate by managing and controlling this Bit line voltage drop waiting time (read time) using the read parameter management table 800.

Inter-cell interference in flash memory cells has become marked in recent years as a result of downscaling. As used here, inter-cell interference refers to the threshold voltage of a certain cell affecting the threshold voltage of an adjacent cell. The impact of this inter-cell interference is a factor in the generation of a fail bit, generally referred to as back pattern noise.

A case in which the data of the WL 2 cell shown in FIG. 16 is read will be explained here as an example of back pattern noise. When reading data from the WL 2 cells, the FM chip 1600 treats all the WLs except WL 2 as non-select lines, and applies a pass voltage (Vpass) to the non-select lines to set all the cells coupled to the non-select lines to a conductive state. Various types of read voltages are applied to the WL 2. Since the read voltages applied to the WL 2 are smaller than the pass voltage at this time, the threshold voltages of the cells of WL 1 and WL 3 located adjacent to the WL 2 appear to be equivalently increased due to the affect of inter-cell interference. Therefore, at normal pass voltage, the cells of the WL 1 and the WL 3 do not become sufficiently conductive and the ON resistance of the cells increases. As a result, even in a case where the threshold voltages of the cells of the WL 2, which is the select line, are smaller than the read voltage, the current flows, and the Bit line voltage drop occurs, there are cases in which the current does not flow sufficiently due to the affects of the ON resistance of WL 1 and WL 3, and the Bit line voltage does not drop sufficiently within the established time. As a result of this, the threshold voltages of the cells coupled to the WL 2, which is the read target, appear to increase equivalently, and the bit read data is in error. This phenomenon is back pattern noise.

A method, which increases the pass voltage applied to the non-select lines, is known as a method for alleviating the affects of the back pattern noise. Substantially increasing the pass voltage sufficiently lowers the ON resistance of the cells coupled to the non-select lines, making it possible to accurately read the data. However, increasing the pass voltage is an operation, which applies a voltage in the direction for injecting an electron onto the floating gate 1803 of each cell, and repetitive high pass voltage reads cause the electron to be injected into the floating gate 1803 and increase the likelihood of the occurrence of an event (a read disturb) in which the threshold distribution is changed.

For this reason, it is preferable that the voltage applied to a non-select line only be increased when an increase in fail bits makes it is impossible to acquire accurate data. The back pattern noise here appears to be marked immediately after a data write to a cell in which a drop in the threshold voltage has not occurred over time as a result of the cell threshold voltage having shifted in the increase direction. On the other hand, since the cell threshold voltage decreases over time following a data write, the affect of an increase in fail bits resulting from back pattern noise becomes modest. That is, it is preferable that the pass voltage applied to the non-select line to alleviate the affects of back pattern noise be changed for each storage area in accordance with the passage of time subsequent to a data write. In Example 1, the voltage applied to the non-select line can be managed and appropriately controlled using the read parameter management table 800.

Also, as was described hereinabove, since cells for which the threshold voltages increase equivalently are on the word lines neighboring the select line (for example, WL 1 and WL 3 in a case where the select line is WL 2), and since back pattern noise is effectively decreased by increasing only the pass voltage applied to the word lines neighboring the select line, it is preferable that a word line for which the pass voltage is to be increased at the time of a read be able to be selected. In Example 1, a non-select line for which the pass voltage applied to the non-select line is to be changed can be managed and appropriately controlled using the read parameter management table 800.

(1-2) Configurations of Various Management Information

Next, the management information of Example 1 will be explained.

FIG. 5 is a diagram showing an example of an address translation table related to Example 1.

The address translation table 500 stores a row (a record) comprising an LBA column 501 and a PBA column 502 for each page (4 KB in the example of this drawing). The LBA column 501 stores a first address (LBA) of data stored in a single page. The PBA column 502 stores an address (PBA), which uniquely identifies a physical page for storing the data of the corresponding LBA from among multiple FM chips 120 of the flash memory module 100. A value denoting unallocated is stored in the PBA column 502 corresponding to a LBA, which is not associated with a PBA.

In Example 1, the processor 115 uses the address translation table 500 to translate a LBA specified from the higher-level apparatus 101 (a host or the like) to a PBA, which is an internal address of the flash memory module 100. In the address translation table 500 shown in FIG. 5, an example in which an LBA and a PBA are associated in page size units is shown, but the association unit is not limited to the page size unit. For example, a LBA and a PBA may be associated and managed in the address translation table using a block size unit.

FIG. 6 is a diagram showing an example of a block management table related to Example 1.

The block management table 600 stores various types of information related to blocks in all the FM chips 120 and so forth mounted in the flash memory module 100. The block management table 600 comprises a record comprising a PBA Group column 601, a Chip number column 602, a Block number column 603, a number of Erases column 604, a last write Page column 605, and a First Page program date/time column 606 for each block (1 MB in the example of this drawing) managed in accordance with a PBA.

The PBA Group column 601 stores a first address (PBA) of a PBA Group (block), which is the size of a block. The Chip number column 602 stores the Chip number of the FM chip (120 and so forth), which comprises one or more PBA Groups. In Example 1, chips with small Chip numbers are associated in order from the PBA Group of the previous address as shown in the drawing. The Block number column 603 stores a Block number in a FM chip, which is associated with the PBA Group. In Example 1, small Block numbers are associated in order from the PBA Group of the previous address as shown in the drawing. The number of Erases column 604 stores a cumulative value of the number of erases performed with respect to the corresponding block inside the corresponding FM chip. In Example 1, the cumulative value of the number of erases is updated by being incremented by 1 when the corresponding block is erased.

The last write Page column 605 stores the number of a page for which a current write has ended in the corresponding block (a block denoted by a Block number in the Block number column 603) of the corresponding FM chip (an FM chip denoted by a Chip number in the Chip number column 602). In Example 1, the processor 115 acquires the next recording page in the corresponding block by acquiring this page number and incrementing this page number by 1. In a case where data is recorded in all of the pages in the block, the last write Page column 605 stores the number of the last page. Therefore, when the number of the last page is stored in the last write Page column 605, this indicates that the corresponding block is not able to record data until the next time it is erased.

The First Page program date/time column 606 stores the date and time (the First Page program date/time) of programming performed with respect to the first page of the corresponding block. As used here, programming refers to data being written to a block from the register of the FM chip 120. In Example 1, the flash memory module 100 manages the current date and time, and when programming is performed with respect to the first page of the corresponding block, registers the date and time of this programming in the First Page program date/time column 606. The difference between this date/time and the current date/time can be used to identify the elapsed time since initial programming subsequent to an erase of the relevant block. For a block for which first-page programming has not been performed, that is, for block for which all the pages are in the erased state, a value denoting not written is stored in the First Page program date/time 606. In Example 1, the flash memory controller 110 performs control to prohibit programming to a page in a block for which one day or longer has passed since the First Page program date/time even in a case where the block comprises a not-written page for the purpose of keeping variations in the programming dates/times of the pages in the block within a fixed range. Therefore, in Example 1, variations in the recorded dates/times of the pages in a block fall within a range of a maximum of 24 hours. According to this kind of management, it is possible for a read parameter, which is acquired using the elapsed time from the programming of a page to be shared with each page in the relevant block, enabling the acquisition of an appropriate read parameter.

Figure 7:
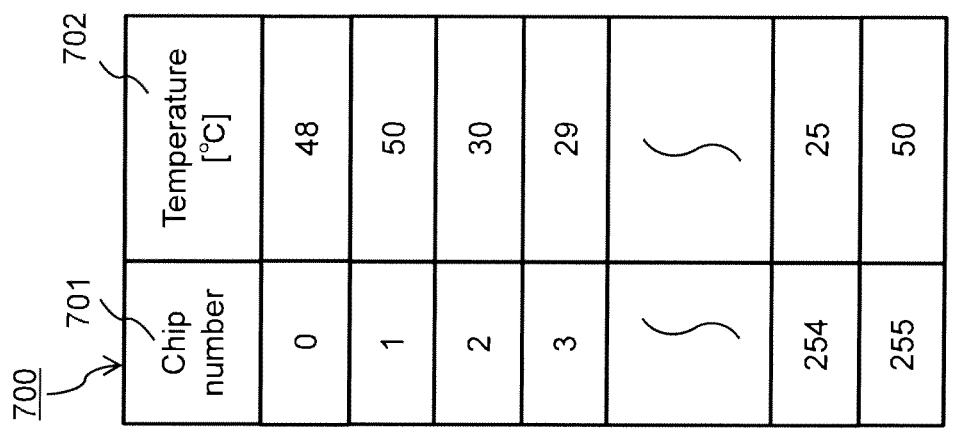
FIG. 7 is a diagram showing an example of an ambient temperature management table related to Example 1.

FIG. 7 is a diagram showing an example of an ambient temperature management table related to Example 1.

The ambient temperature management table 700 stores a row (a record), which comprises a Chip number column 701 and an ambient temperature column 702 respectively corresponding to all the FM chips of the flash memory module 100. The Chip number column 701 stores the number of a chip of the flash memory module 100. The ambient temperature column 702 stores the ambient temperature of the FM chip of the corresponding Chip number. In Example 1, the processor 115 regularly acquires the temperature of each FM chip from each FM chip, and updates the value in the temperature column 702. In Example 1, an example is shown in which an instantaneous temperature is stored in the temperature column 702, but the present embodiment is not limited to this example, and, for example, the processor 115 may record multiple temperatures of an FM chip at fixed intervals and store an average value for a fixed period in the temperature column 702.

FIG. 8 is a diagram showing an example of a read parameter management table related to Example 1.

The read parameter management table 800 is a two-dimensional table, which references a corresponding read parameter using two values, i.e. a number of erases 801 of a block, and an elapsed time since data was recorded 802 in a block. In Example 1, the read parameter management table 800 is storing read parameters corresponding to conditions in a case where the FM chip is being exposed to an ambient temperature of 25 degrees C. (Celsius) (an example of a standard temperature). That is, the stored read parameters are able to minimize the fail bits (bits for which the recorded data has changed) included in read data under conditions in which the FM chip is exposed to an ambient temperature of 25 degrees C. In Example 1, a special read, which uses this read parameter, is always performed when a read is requested from the higher-level apparatus 101. More specifically, the processor 115, upon receiving a read request from the higher-level apparatus 101, acquires an appropriate read parameter by referencing the read parameter management table 800 using the number of erases and the elapsed time since data recorded of the read-target area (the read-target block), and after notifying the FM chip (120 and so forth) of the acquired read parameter, performs a read of the corresponding data, that is, sends a read command.

According to this operation, it is possible to reduce the probability of an ECC correction becoming impossible due to too many fail bits, and it is possible to reduce the frequency of occurrence of an operation, which causes a drop in performance, such as changing the read parameter and performing a read once again after detecting that correction is impossible using the ECC as in the past.

The read parameters stored in the respective columns of the read parameter management table 800, for example, comprise a time for waiting for the voltage of the Bit line to drop ("Read time"), the values of a read voltage applied to a select word line in a cell array of an FM chip (that is, a cell group of the read-target page) or a read criteria ("Level 1" (Vr (Level 1) of FIG. 18), "Level 2" (Vr (Level 2) of FIG. 18), and "Level 3" (Vr (Level 3) of FIG. 18) equivalent to the read voltage, a voltage value of a pass voltage ("Changed Vpass") applied to a non-select word line (a cell group of a page other than the read page belonging to the same block as the read-target page), and information ("adjacent" or "all") denoting the type of WL ("Changed Vpass WL") for which the pass voltage changes. The changed Vpass WL type "adjacent" here denotes the application of a pass voltage (Changed Vpass) to a non-select line located adjacent to the select word line, and all denotes the application of the pass voltage (Changed Vpass) to all the non-select word lines.

According to the read parameter management table 800 shown in FIG. 8, for example, it is clear that the appropriate read parameter for a block with a number of erases of 500 and an elapsed time since data recorded of one day is a parameter, which has a read time of a [ms], a level 1 read voltage of b [V], a level 2 read voltage of c [V], a level 3 read voltage of d [V], and a changed Vpass of e [V], and which applies the changed Vpass only to the adjacent non-select word line(s).

The read parameter is not limited to the parameters shown in FIG. 8, and may include any kind of parameter as long as it has an amount of control internal and external to the FM chip for changing the number of fail bits included in the read data when data is read from the FM chip. In addition, the parameters included in the read parameter are not limited to combinations of the parameters shown in FIG. 8, but rather may be a parameter, which includes at least one of these types of parameters.

In Example 1, an appropriate read parameter for each condition (elapsed time since data recorded and number of erases) is stored in the read parameter management information 800. The drawing shows an example in which the read parameters are managed by partitioning the elapsed time since data recorded 802 into units of one day, but the present embodiment is not limited to units of one day, and, for example, partitioning can be in units of one hour, the point being that as long as the unit of time denotes the elapsed time since the data was recorded, partitioning may be done using any unit of time. In addition, the drawing shows an example in which the read parameter is managed by partitioning the number of erases 801 into units of 500 times, but the present embodiment is not limited to units of 500 times, and, for example, partitioning may be done in units of 100 times, the point being that partitioning may be done in units of an arbitrary number of times, which is considered effective at reducing a drop in performance.

Generally speaking, the fact that the rate of progress of a change in the state of a threshold voltage inside a cell differs in accordance with the ambient temperature of the FM chip is known. For example, the state of a cell in a case where the elapsed time since data recorded is five days in a 50 degrees C. environment may be equivalent to the state of a cell in a case where the number of elapsed days since data recorded is 128 days in a 25 degrees C. environment. In Example 1, the processor 115 acquires the ambient temperature of a read-target FM chip from the ambient temperature management table 700 at the time the processor 115 references the read parameter management table 800. Then, the processor 115 converts from this ambient temperature and the elapsed time since data recorded of the read-target area (block) to the elapsed time since data recorded in a 25 degrees C. environment, which is the temperature condition of the read parameter management table 800, and references the read parameter management table 800. The conversion to an elapsed time at a prescribed temperature here can be realized by using the well-known Arrhenius equation. In addition, in Example 1, an example, which uses the read parameter management table 800 only in a 25 degrees C. environment, is given, but the present embodiment is not limited to this example. For example, the RAM 113 may store a read parameter management table corresponding to each assumed ambient temperature. In accordance with this, it becomes possible for the processor 115 to acquire an appropriate read parameter by using a read parameter management table, which corresponds to the ambient temperature of a FM chip in which there is a read-target area.

In Example 1, the respective values of the read parameter are configured by searching for an appropriate read parameter for each number of erases and elapsed time since data recorded at the time of a preliminary inspection subsequent to the flash memory module having been manufactured but prior to its being shipped using a different flash memory module having the same configuration as a sample. The respective values of the read parameter are updated in a read parameter search process (refer to FIG. 10), which will be explained further below, after the flash memory module has been in operation.

Next, various operations of the flash memory module related to Example 1 will be explained.

(1-3) Read Operation

A read operation of the flash memory module 100 related to Example 1 will be explained.

Figure 9:
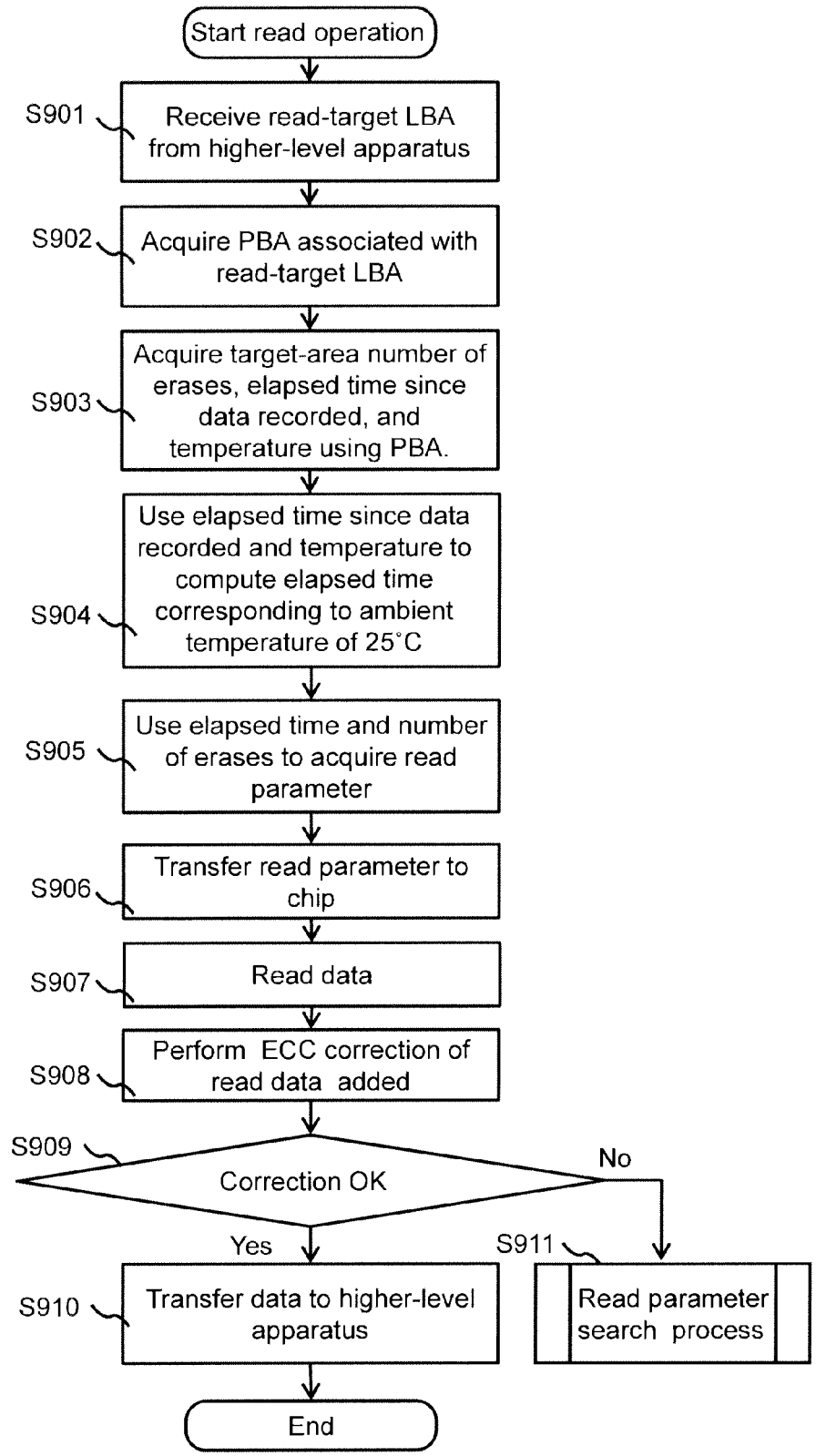
FIG. 9 is a flowchart of a read operation process related to Example 1.

FIG. 9 is a flowchart of a read operation process related to Example 1.

In the read operation process, first, in a case where the processor 115 acquires a read request and a read-target LBA from the higher-level apparatus 101 (Step S901), processor 115 references the address translation table 500, and acquires a PBA (called a read-target PBA in this process) with which the acquired read-target LBA is associated (Step S902).

Next, the processor 115 references the block management table 600 and acquires various information about the block to which the acquired read-target PBA belongs (Step S903). More specifically, the processor 115 searches the PBA Group column 601 of the block management table 600, and finds the row (record) of a PBA Group corresponding to the read-target PBA. Next, the processor 115 acquires the values of the found row Chip number column 602, Block number column 603, number of Erases column 604, and First Page program date/time column 606. Then, the processor 115 determines the elapsed time since data recorded by computing the difference between the date and time of the current date/time managed by the flash memory module 100 and the First Page program date/time column 606. Next, the processor 115 references the ambient temperature management table 700 and searches the Chip number column 701 for a row (record), which corresponds to the Chip number acquired from the block management table 600. Then, the processor 115 acquires the value (temperature) stored in the temperature column 702 of the corresponding row as the ambient temperature of the read-target area.

Next, the processor 115 uses the acquired ambient temperature to convert the computed elapsed time since data recorded to an elapsed time since data recorded in a 25 degrees C. environment, which is the temperature condition of the read parameter management table 800 (Step S904). For example, the processor 115 uses the well-known Arrhenius equation to determine an acceleration factor between 25 degrees C. and the acquired ambient temperature, and determines the elapsed time since data recorded in a 25 degrees C. environment by multiplying the product of this acceleration factor by the elapsed time since data recorded computed in Step S903. In Example 1, an example, which uses a read parameter management table 800 only under an ambient temperature of 25 degrees C. is given, but in a case where read parameter management tables corresponding to respective ambient temperatures are stored, the process for converting to an elapsed time at the reference temperature of Step S904 is not necessary.

Next, the processor 115 uses the elapsed time since data recorded converted in Step S904 and the number of erases acquired in Step S903 to acquire a read parameter suitable for a read process from the read parameter management table 800 (Step S905). More specifically, the processor 115 references the read parameter management table 800 and searches for a row to which the elapsed time since data recorded computed in Step S904 corresponds. Then, the processor 115 identifies and acquires the read parameter by searching in the corresponding row for the column to which the number of erases acquired in Step S903 corresponds. In a case where either the number of erases or the elapsed time since data recorded do not match the segment value of the read parameter management table 800, the closest segment value may be used as the relevant value. In the read parameter management table 800 shown in FIG. 8, in a case of 800 erases, the column for 1000 erases may be used as the relevant column, and in a case of 700 erases, the 500 erases column may be used as the relevant column.

Next, the processor 115 transfers the read parameter acquired in Step S905 to the read-target FM chip (Step S906). More specifically, the processor 115 instructs the flash memory interface 117 to transfer the read parameter to the read-target FM chip. The flash memory interface 117, which receives the instruction, uses a data transfer bus to transfer the read parameter (the values of the read time, read voltages for reading each threshold voltage of the cell, and so forth) to the read-target FM chip. In Example 1, an example, which transfers a read parameter to an FM chip (120 and so forth) using a data transfer bus is given, but the present embodiment is not limited to this example. For example, the processor 115 may notify the FM chip of the read parameter using a dedicated read parameter transfer channel. In addition, the flash memory interface 117 may create a read voltage and supply this voltage to the FM chip. In a case where the flash memory interface 117 creates the read voltage, the flash memory interface 117 may interpret the voltage value of the read voltage in the read parameter acquired in Step S905, create a corresponding voltage, and supply this voltage to the read-target FM chip.

Next, the processor 115 issues a special read command (a command for performing a read using the sent read parameter) to the FM chip to which the read parameter was transferred, and performs a data read (Step S907). More specifically, the processor 115 instructs the flash memory interface 117 to transfer the special read command to the relevant FM chip and to read the data thereafter. The flash memory interface 117, which received the instruction, in accordance with issuing the special read command, reads the data from the relevant FM chip and stores the data in a buffer inside the flash memory interface 117.

Next, the processor 115 performs data error correction on the read data read in Step S907 using the ECC appended to the read data (Step S908).

Next, the processor 115 determines whether or not the data error correction in Step S908 was successful, that is, whether or not the data read was a success (Step S909). Here, in a case where either there were no errors in the data, or there were errors in the data but the errors were able to be corrected by the ECC, the data correction is handled as a success. In a case where the result is that the data error correction was a success (Step S909: Yes), the processor 115 transfers the data for which the data error correction was successful to the read request-source higher-level apparatus 101 (Step S910). Alternatively, in a case where the ECC-based data error correction failed (Step S909: No), the processor 115 starts a read parameter search process (refer to FIG. 10) (Step S911).

In Example 1, since an appropriate read parameter is decided on the basis of the number of erases and the elapsed time since data recorded of the read-target block, and a read is performed in accordance with this read parameter, there is a relatively high probability that the data correction of the data read from the FM chip will be successful, lowering the likelihood of a read parameter search process being performed. Therefore, a decrease in processing efficiency during the read process can be adequately prevented.

(1-4) Read Parameter Search Operation

Next, a read parameter search process of Example 1 will be explained.

Figure 10:
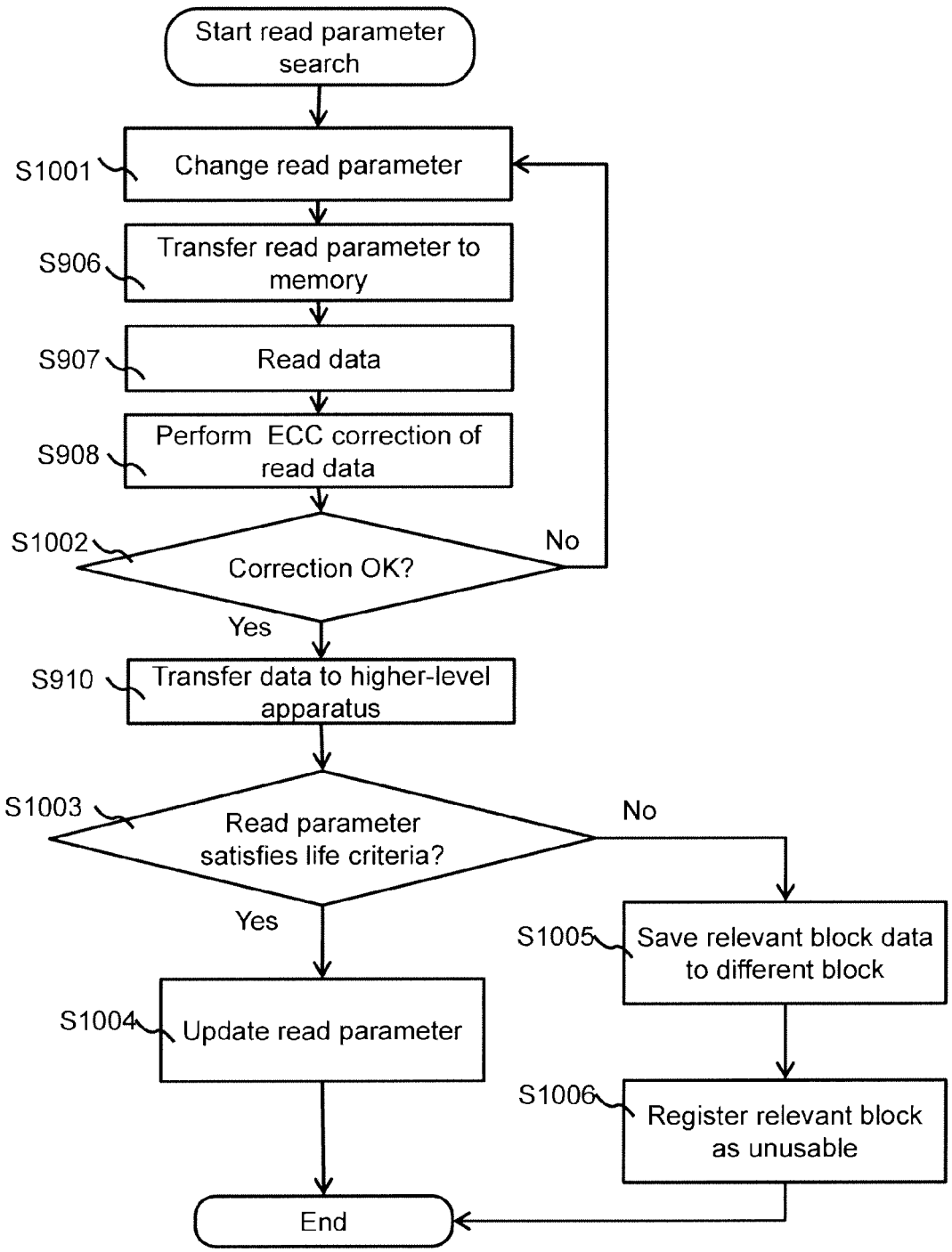
FIG. 10 is a flowchart of a read parameter search process related to Example 1.

FIG. 10 is a flowchart of a read parameter search process related to Example 1. The same step numbers will be assigned to steps, which are the same as those in the read operation process shown in FIG. 9, and duplicate explanations will be omitted.

The start of the read parameter search process is triggered by the fact that an ECC correction is not possible with respect to data read from an FM chip in a read operation process (Step S911 of FIG. 9).

In the read parameter search process, the processor 115 first changes the read parameter to be used in a read from the read parameter used previously (Step S1001). The processor 115 changes to a read parameter here that may lower the number of fail bits. For example, in a case where the ECC correction was not possible, the processor 115 slightly changes (for example, lowers) the read voltage included in the previously used read parameter.

After Step S1001, the processor 115 performs the same processing as that of Steps S906 through S908 using the changed read parameter, performs the processing for reading data from the FM chip, and advances the processing to Step S1002.

In Step S1002, the processor 115 determines whether or not the data error correction of Step S908 was successful. In a case where the result is the ECC-based data error correction failed (Step S1002: No), the processor 115 shifts the processing to Step S1001, changes to a different read parameter, and executes the process for reading data from the FM chip. In accordance with the branching at the No in this Step S1002, in Example 1, the read parameter is changed until the read data becomes correctable using the ECC. In a case where the processing of Steps S1001 through S908 have been repeated at least a fixed number of times, the processor 115 may notify the higher-level apparatus 101 that a data read is not possible and end the read parameter search process.

Alternatively, in a case where the data error correction is successful (Step S1002: Yes), the processor 115 transfers the data for which the data error correction was successful to the read request-source higher-level apparatus 101 (Step S910).

Next, the processor 115 compares the read parameter with the life criteria, and determines whether or not the read parameter satisfies the life criteria (Step S1003). The life criteria here, for example, may be an upper limit value of a difference between a value of the read parameter for which the data error correction succeeded and a value of a read parameter acquired from the read parameter management table 800.

In a case where the upper-limit value is used as the life criteria, and the difference between the value of the read parameter for which the data error correction succeeded and the value of the read parameter acquired from the read parameter management table 800 exceeds the prescribed upper limit value (a particularly large difference), that is, in a case where the life criteria is not satisfied (Step S1003: No), a determination can be made that the state of deterioration of the read-target block differs greatly with the state of deterioration predicted on the basis of the respective management information, such as the block temperature, the number of erases, and the elapsed time since data recorded. In accordance with this, it is preferable that the read-target block be regarded as unusable since this block will become a destabilizing factor in the reliability of the flash memory module 100 in the future (that is, there is a high likelihood that the EC-based correction will not be possible when reading recorded data). Consequently, in Example 1, in this case (Step S1003: No), the processor 115 saves the data of the relevant block to a different block to treat the relevant read-target block as unusable (Step S1005). Specifically, the processor 115 reads all of the data in the read-target block one time, and writes this data to another block after performing an ECC correction. Then, the processor 115 changes from the migration-source block to the migration-destination block in the address translation table 500. More specifically, the processor 115 searches the address translation table 500 for the LBA referencing the PBA of each page of the migration-source block, and changes the PBA associated with this LBA to the PBA of each page of the migration-destination block. Next, the processor 115 registers the relevant read-target block as an unusable block (Step S1006). In accordance with this, the relevant block will not be used subsequent to this.

The life criteria may be a fixed value here. For example, in a case where a changed value of the read voltage, which constitutes a reference, is used as the read parameter, the upper-limit value (threshold) with respect to the changed value of the reference read voltage may be used as the life criteria. When the life criteria is not satisfied in this case, this will indicate that a change, which exceeds the upper-limit value of the changed value constituting the life criteria, was needed with respect to the reference read voltage in order for the ECC-based read data correction to be successful.

Alternatively, a case in which the life criteria is satisfied in Step S1003 (Step S1003: Yes) signifies the likelihood that the read parameter configured in the read parameter management table 800 is not appropriate. In Example 1, the values of the read parameter management table 800 are values, which were searched out and registered at the time of the sample inspection prior to shipment, and the sample inspection values may not necessarily be suitable as a result of differences between the samples and the actual products. For this reason, in Example 1, in a case where the read parameter, which was changed in the read parameter search process, has been changed within a fixed range from the read parameter registered value of the read parameter management table 800, this post-change read parameter is considered to be a more suitable value with respect to the utilization status of the read-target block. Consequently, in this embodiment, in a case where the life criteria is satisfied in Step S1003 (Step S1003: Yes), the processor 115 updates the corresponding read parameter of the read parameter management table 800 to the read parameter changed in Step S1001 (Step S1004). Specifically, the processor 115 references the read parameter management table 800, updates the read parameter in the locations corresponding to the number of erases and the elapsed time since data recorded of the read-target block to the read parameter changed in Step S1001, and ends the read parameter search process.

As has been explained hereinabove, in the flash memory module related to Example 1, it is possible to read data from a relevant read-target area using an appropriate read parameter (read voltage and read method), which is decided on the basis of attribute information (temperature, number of erases, elapsed time since data recorded) of the read-target area at the time of the read. Therefore, there is a lower probability of an ECC-based correction not being possible for the read data. As a result, it is possible to lower the number times that a special read is performed using a parameter change in accordance with a read parameter search process when an ECC-based correction is not possible, and to appropriately alleviate drops in flash memory module performance.

Example 2

Next, a computer system related to Example 2 will be explained.

In Example 1, an example is given in which, when the flash memory module 100 receives a read request from the higher-level apparatus 101, the number of times a read is re-executed is reduced in accordance with acquiring an appropriate read parameter based on the attribute information (temperature, number of erases, and elapsed time since data recorded) of the read-target area of this read request, and reading the data from the FM chip using this read parameter.

In contrast to this, in Example 2, a check is performed with respect to each storage area of the flash memory module 100 at a timing (for example, regularly), which differs from a read request by the higher-level apparatus 101, and a read parameter, which actually makes a read possible for each storage area, is identified beforehand. Then, when there is a read request from the higher-level apparatus 101, a read is executed using the pre-identified read parameter. According to Example 2, it is possible to reduce the number of times that a read is re-executed.

In addition, in Example 2, the state of deterioration of a storage area (more specifically, a block unit) is identified using a read parameter via which a read is actually possible.

In accordance with this, the equalization of deterioration of the FM chips of the flash memory module 100 can be performed more effectively than deterioration equalization (the so-called wear leveling, which uses the number of erases) using the cumulative number of block erases, which is generally performed. The reason for this is because even though the cumulative number of erases is a primary factor in the deterioration (more specifically, the drop in the insulating capabilities as well as the trapping of electrons in the oxide layer of the cell) of a block in an FM chip, significant changes in deterioration are also the result of values recorded in the past, an acquired cell utilization state, such as a rewrite interval, and inherent differences in flash memory cell quality. That is, the cumulative number of erases is not an index for definitively expressing the state of deterioration of a block in a FM chip. On the other hand, a read parameter via which a read is actually possible, which is used as the deterioration-denoting index in Example 2, changes in accordance with the number of electrons being stored in the cell. For this reason, the changing of the read parameter during a fixed period of time following the recording of data denotes either that the insulating capabilities of the cell's oxide insulating layer have diminished or that large numbers of electrons have become trapped in the oxide insulating layer or the boundary. Therefore, the read parameter via which a read is actually possible expresses the state of deterioration of a FM chip block more directly than the cumulative number of erases. For these reasons, a deterioration equalization process, which uses a read parameter via which a read is actually possible is more effective at equalizing the deterioration of the FM chips than a deterioration equalization process, which uses the cumulative number of erases.

(2-1) Flash Memory Module Configuration

The hardware configuration of the flash memory module related to Example 2 is the same as the hardware configuration of the flash memory module related to Example 1 in FIG. 1, and as such, an explanation will be omitted. The same reference signs are used for parts of the flash memory module related to Example 2 that are the same as the parts of the flash memory module related to Example 1.

(2-2) Configurations of Various Management Information

Next, management information related to Example 2 will be explained.

Management information 118 related to Example 2 comprises the same address translation table 500 as Example 1, a block management table 1100, and the same ambient temperature management table 700 as Example 1. Since the address translation table 500 and the ambient temperature management table 700 are the same as those of Example 1, explanations will be omitted.

FIG. 11 is a diagram showing an example of a block management table related to Example 2.

The block management table 1100 related to Example 2 adds a read parameter (Read parameter) column 1107 and a degree of deterioration column 1108 to each record of the block management table 600 related to Example 1.

The Read parameter column 1107 stores a read parameter, which is suitable for each block (has a low probability of an ECC correction not being possible). In this embodiment, a detected read parameter is stored in a read parameter check & update process (see FIG. 13). In Example 2, when there is a read request from the higher-level apparatus 101, the flash memory controller 110 identifies the relevant block in the read-target area and acquires the appropriate read parameter associated with this block. Then, the flash memory controller 110, after transferring the acquired read parameter to the FM chip (120 and so forth), reads the target-area data from the FM chip.

A degree of deterioration of a corresponding PBA Group is stored in the degree of deterioration column 1108. A number of erases is one index for denoting the state of deterioration of a PBA Group, but in Example 2, a value computed in a refresh necessity determination process is used as an evaluation value (the degree of deterioration in Example 2) for determining the state of deterioration of each PBA Group. FIG. 11 shows an example in which a read parameter and a degree of deterioration representing this block are stored in block units, but the management unit for the read parameter is not limited to block units. For example, a read parameter may be managed in page units.

(2-3) Read Operation

Next, a read operation of the flash memory module 100 related to Example 2 will be explained.

Figure 12:
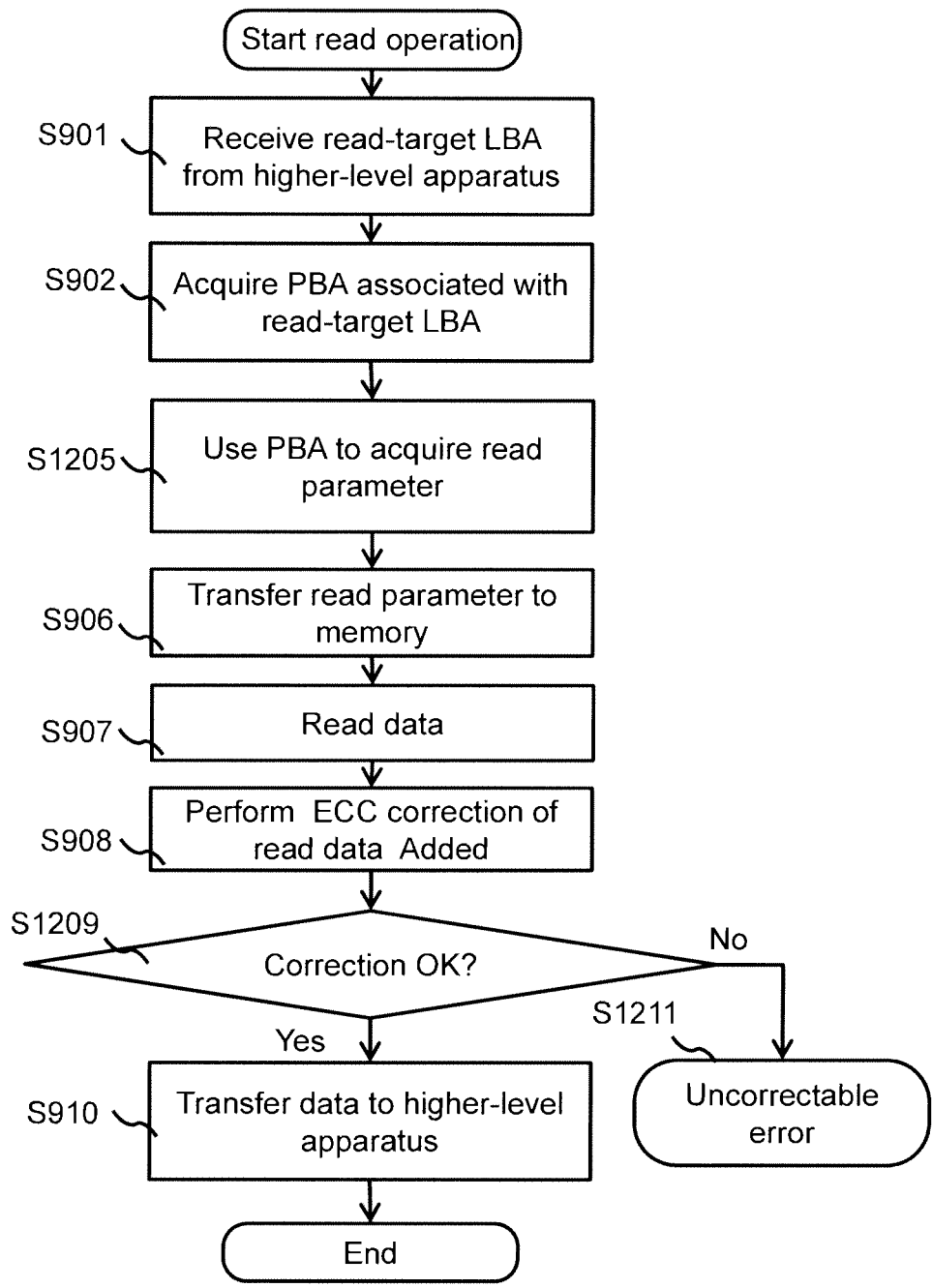
FIG. 12 is a flowchart of a read operation process related to Example 2.

FIG. 12 is a flowchart of the read operation process related to Example 2. The same reference signs will be assigned to steps, which are the same as those of the read operation process related to Example 1, and detailed explanations of these steps will be omitted.

In Step S1205 in Example 2, the processor 115 uses the PBA acquired in Step S902 to acquire a read parameter corresponding to the relevant PBA from the block management table 1100. More specifically, the processor 115 references the block management table 1100 and searches the row of the PBA Group to which the PBA acquired in Step S902 belongs. Then, the processor 115 acquires the value stored in the Read parameter column 1107 of the searched PBA Group row as the read parameter. This read parameter is transferred to the FM chip in Step S906. As a result, it is possible to read data in which there are either no or few fail bits from the FM chip in Step S907, heightening the likelihood that the ECC-based correction in Step S908 will be successful.

In Step S1209, which follows Step S908, the processor 115 determines whether or not the data error correction in Step S908 was successful. In a case where the result is that the data error correction was successful (Step S1209: Yes), the processor 115 transfers the data for which the data error correction succeeded to the read request-source higher-level apparatus 101 (Step S910). Alternatively, in a case where the ECC-based data error correction failed (Step S1209: No), the processor 115 notifies the higher-level apparatus 101 of the failure as an uncorrectable error (Step S1211).

(2-3) Read Parameter Check & Update Operation

Next, a read parameter check and update operation of the flash memory module 100 related to Example 2 will be explained.

Figure 13:
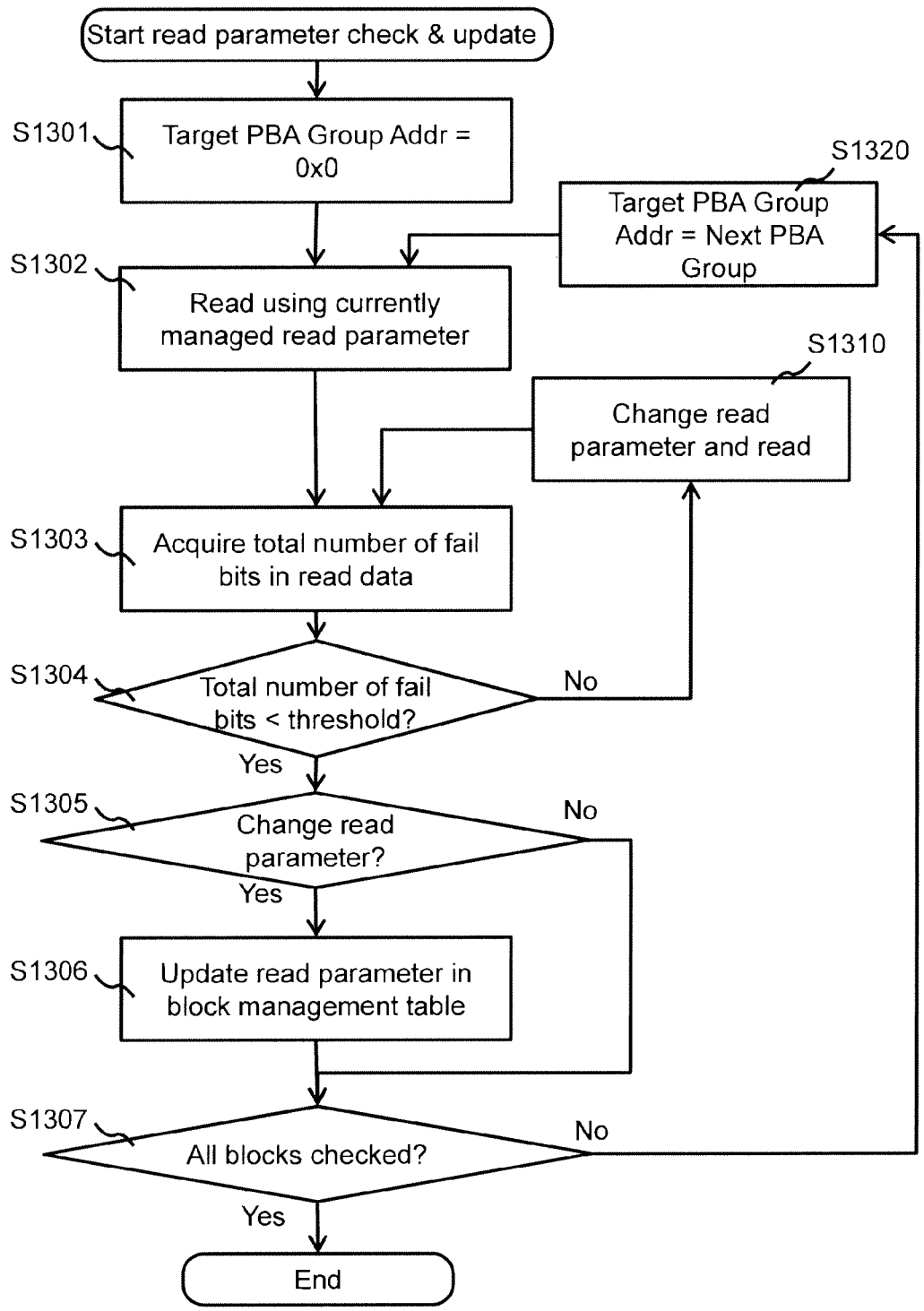
FIG. 13 is a flowchart of a read parameter check and update process related to Example 2.

FIG. 13 is a flowchart of the read parameter check and update process related to Example 2.

The read parameter check and update process, for example, is executed once a day. The read parameter check and update process may be performed at any interval. In other words, the read parameter check and update process may be performed at any interval as long as it is possible to manage a read parameter for each block so that an ECC-based fail bit correction is actually possible (there is a sufficiently small probability of a fail bit not being able to be corrected) when there is a read request from the higher-level apparatus 101.

In the read parameter check and update process, first the processor 115 acquires the initial address of a PBA Group being managed by the flash memory module 100 in order to check all the blocks (the check is skipped for a block that has not been written to) in the flash memory module 100, and configures the relevant address as the address of the check-target PBA Group (the target PBA Group address) (Step S1301).

In Step S1302, the processor 115 uses the read parameter, which is stored in the Read parameter column 1107 of the row corresponding to the PBA Group in the block management table 1100 at this point in time, to perform a read with respect to the PBA Group denoted by the target PBA Group address configured in either Step S1301 or Step S1320, which will be explained further below. At this time, the read reads all the PBA areas belonging to the PBA Group (more specifically, all the pages in the block denoted by the PBA Group). In Example 2, an example is given in which all the PBA (pages) in a PBA Group (block) are read, but the present embodiment is not limited to this example. A substantial portion of the PBA area for determining the state of deterioration of each PBA Group may be read. In the case of a MLC-type FM chip, only the pages comprising the MSB (Most Significant Bit) may be read in following processing.

Next, the processor 115 acquires a total value of the number of fail bits (total number of fail bits) included in the data of the read PBA area (Step S1303). The ECC correction circuit of the flash memory interface 117 of the flash memory module 100 related to Example 2 here comprises a function for notifying the processor 115 of the number of corrected fail bits. The processor 115 computes the total number of fail bits by adding together the number of fail bits notified from this ECC correction circuit. Instead of the total number of fail bits included in the read PBA area data per page, either an average value, a maximum value, or a minimum value of fail bits included in the read PBA area may be acquired. In accordance with this, the acquired value may be used instead of the total number of fail bits.

Next, the processor 115 determines whether or not the acquired total number of fail bits is less than a preconfigured threshold (a number of fail bits threshold) (Step S1304). In a case where the result is that the acquired total number of fail bits is equal to or larger than the preconfigured threshold (Step S1304: No), a determination can be made that there is a certain level of possibility that correction will not be possible with the read parameter that was used when there is a read request from the higher-level apparatus 101, and as such, the processor 115 changes the read parameter, performs the read once again using the changed read parameter (Step S1310), and moves the processing to Step S1303. More specifically, the processor 115 changes the read parameter so as to lower the probability of a correction not being possible, that is, so as to reduce the number of fail bits included in the read data when there is a read request from the higher-level apparatus 101, and performs a read. The changing of the read parameter here may entail slightly changing (for example, reducing) the voltage value of the read voltage included in the read parameter used the previous time.

Alternatively, in a case where the acquired total number of fail bits is less than the preconfigured threshold (Step S1304: Yes), a determination can be made that there is sufficient probability that correction will be possible (a successful read) when there is a read request from the higher-level apparatus 101 in accordance with the read parameter that was used, and as such, the processor 115 determines whether or not the read parameter, with respect to which it was determined that ECC-based fail bit correction would be possible when there is a read request from the higher-level apparatus 101, was changed from the read parameter registered in the block management table 1100 (Step S1305).

When the result is that there is no change in the read parameter (Step S1305: No), the processor 115 shifts the processing to Step S1307, and in a case where there is a change in the read parameter (Step S1305: Yes), the processor 115 updates the read parameter with respect to which it was determined in Step S1304 that an ECC-based fail bit correction would be possible when there is a read request from the higher-level apparatus 101 by storing this read parameter in the Read parameter column 1107 of the corresponding row of the block management table 1100 (Step S1306), and advances the processing to Step S1307.

In Step S1307, the processor 115 determines whether or not the check of all the blocks has ended. More specifically, when the target PBA Group address points to the last PBA Group of all the PBA Groups managed by the flash memory module 100 (Step S1307: Yes), this signifies that the check of all the blocks has ended, and as such, the processor 115 ends the read parameter check and update process.

Alternatively, when the target PBA Group address does not point to the last PBA Group of all the PBA Groups managed by the flash memory module 100 (Step S1307: No), the processor 115, in order to make the next PBA Group the target of the read parameter check and update process, configures the target PBA Group address in the address denoting the next PBA Group (Step S1320), and moves the processing to Step S1302.

(2-4) Refresh Necessity Determination Operation

Next, a refresh necessity determination operation of the flash memory module 100 related to Example 2 will be explained.

Since the electrons stored on the floating gate 1803 inside a cell leak out, the FM chip is able to retain this recorded data with high reliability for a limited time. Therefore, in most flash memory modules, data is read one time and a fail bit(s) is corrected within a fixed period of time following the recording of the data in an FM chip, after which a process for rewriting (refreshing) the data to another area (block) is performed.

A refresh uses the processor 115 and an internal bus of the flash memory module 100, and as such, decreases the processing performance provided to the higher-level apparatus 101. Therefore, it is preferable that the refresh be performed with the minimum frequency required to maintain the reliability of the flash memory module 100. In Example 2, a read parameter detected in accordance with the read parameter check and update process is used to determine the necessity of a refresh with respect to each area (for example, block) in the FM chip. For example, for a read parameter stored in the block management table 1100, in a case where the voltage value of a read voltage, which is one of the setting values in the read parameter, is lower by a prescribed amount than the voltage value of the read voltage (the reference read voltage value) configured so as to be used at the time of a normal read, it is determined that a fixed amount of the electrons stored on the floating gate 1803 inside the cell has leaked out, and a determination is made that a refresh is necessary.

Figure 14:
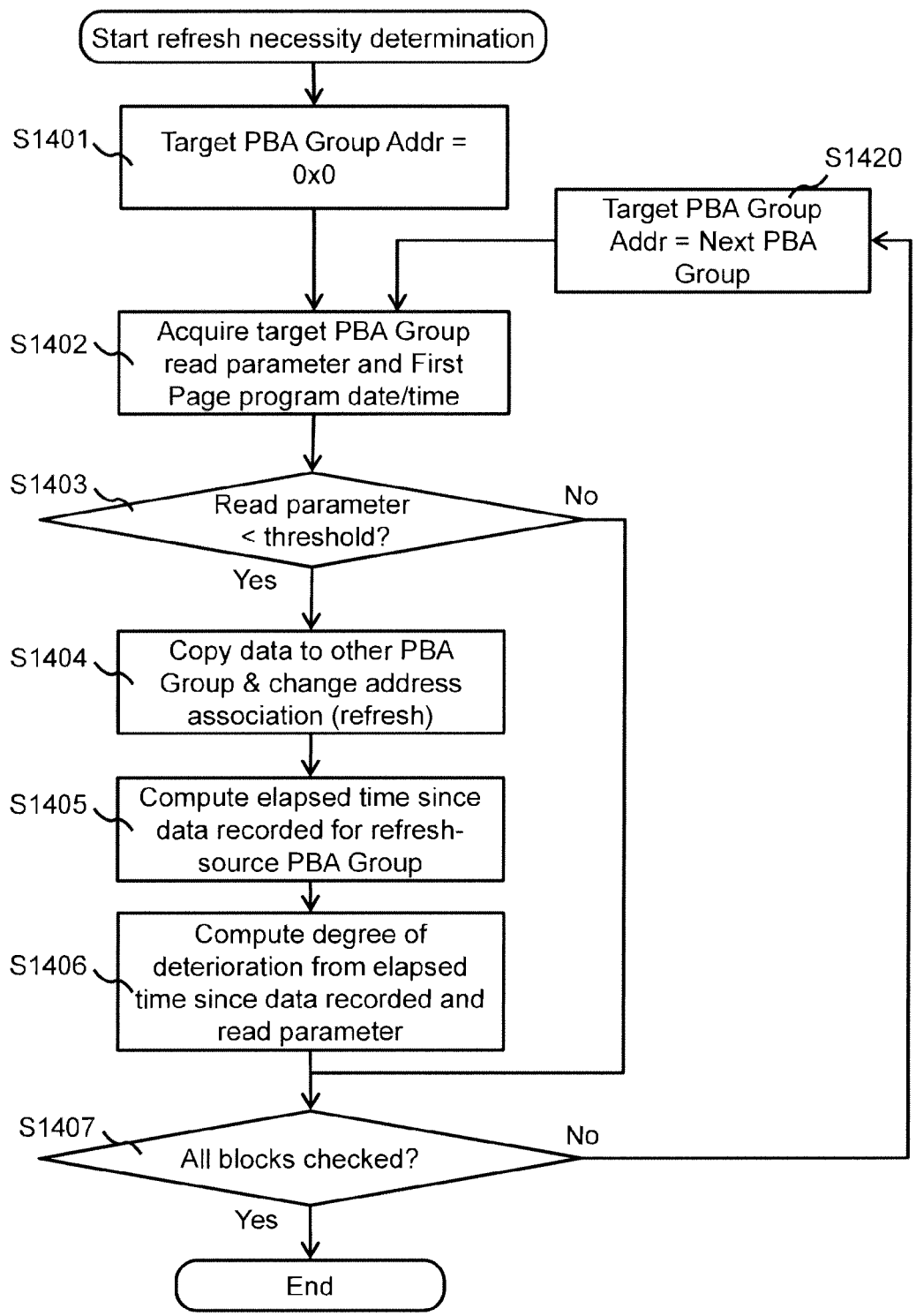
FIG. 14 is a flowchart of a refresh necessity determination process related to Example 2.

FIG. 14 is a flowchart of a refresh necessity determination process related to Example 2.

The refresh necessity determination process, for example, is performed at the minimum once a day, and a determination as to the necessity of a refresh is respectively made for all of the PBA Groups (for example, blocks) of the flash memory module 100.

In the refresh necessity determination process, first, the processor 115 acquires the initial address of a PBA Group being managed by the flash memory module 100 to check all the blocks in the flash memory module 100 (the check is skipped for unwritten blocks), and configures the relevant address as the check-target PBA Group address (Step S1401).

Next, the processor 115 references the block management table 1100 and acquires the value of the Read parameter column 1107 and the value of the First Page program date/time column 606 of the row corresponding to the PBA Group constituting the target of the refresh necessity determination (Step S1402).

Next, the processor 115 determines whether or not the acquired read parameter is less than a prescribed threshold (a refresh threshold) (Step S1403). In Example 2, the threshold here is a threshold for performing a comparison of the voltage values of the read voltages included in a read parameter. In this step, specifically, the processor 115 determines whether the voltage value of the read voltage of a read parameter being managed by the block management table 1100 has fallen below the threshold.

In a case where the result is that the voltage value of the read voltage of the read parameter is equal to or larger than the threshold (Step S1403: No), the processor 115 determines that there is no need to refresh the relevant PBA Group, and shifts the processing to Step S1407. Alternatively, in a case where the voltage value of the read voltage of the read parameter is less than the threshold (Step S1403: Yes), the processor 115 determines that a refresh is needed and shifts the processing to Step S1404.

In Step S1404, the processor 115 executes a refresh, which moves the data of the PBA Group for which a refresh was determined to be necessary to another PBA Group. The flash memory module 100 related to Example 2 performs management such that a fixed amount of unwritten PBA Groups exist at all times, and the processor 115 allocates an arbitrary PBA Group from among these unwritten PBA Groups to serve as a refresh-destination PGA Group. Next, the processor 115 reads data from the FM chip of the PBA Group determined to be in need of a refresh (called the refresh-source PBA Group). The processor 115 uses the ECCs assigned to the data to correct all of the fail bits included in the read data, and writes the post-correction data to the refresh-destination PBA Group. Thereafter, the processor 115 references the address translation table 500, searches all of the rows (records) of the LBAs associated with the PBAs of the refresh-source PBA Group, and rewrites and updates the PBA column 502 of the searched rows so as to point to all of the corresponding PBAs of the refresh-destination PBA Group. Thereafter, the processor 115 erases the data of the refresh-source PBA Group, and registers this erased PBA Group as an unwritten PBA Group.

Next, the processor 115 computes the difference between the value of the First Page program date/time of the refresh-source PBA Group and the current date/time, that is, the elapsed time since data recorded (Step S1405).

Next, the processor 115 uses the computed elapsed time since data recorded and the read parameter acquired in Step S1402 to compute the degree of deterioration for the relevant PBA Group (Step S1406). More specifically, the processor 115, for example, computes the degree of deterioration in accordance with dividing the difference between the reference read voltage value and the read voltage value in the read parameter by the elapsed time since data recorded. The degree of deterioration shows the amount of the voltage drop in the cell(s) of the corresponding PBA Group per unit of time, and is an index, which expresses the speed at which the PBA Group data is lost. Since the amount of the voltage drop in the PBA Group cell(s) per unit of time increases the more the PBA Group cell(s) deteriorates, a larger degree of deterioration signifies that PBA Group cell deterioration is progressing. The degree of deterioration is used in a deterioration equalization process (wear leveling), which will be explained further below.

Next, the processor 115 determines whether or not the checks of all the blocks have ended (Step S1407). More specifically, since a case in which the check-target PBA Group address points to the last PBA Group of all the PBA Groups managed by the flash memory module 100 (Step S1407: Yes) signifies that the checks of all the blocks have ended, the processor 115 ends the refresh necessity determination process.

Alternatively, in a case where the check-target PBA Group address does not point to the last PBA Group of all the PBA Groups managed by the flash memory module 100 (Step S1407: No), the processor 115, in order to make the next PBA Group the target of the refresh necessity determination process, configures the check-target PBA Group address in the address denoting the next PBA Group (Step S1420), and moves the processing to Step S1402.

(2-5) Degree of Deterioration and Wear Leveling

The FM chip (120 and so forth) is a device, which deteriorates in accordance with repeated writes and erases (erasing). For this reason, in a case where accesses have been concentrated on a portion of the areas of the FM chips of the flash memory module 100, the reliability of the specific portion of the areas of the FM chips will decrease in a short period of time, and the data storage reliability of the flash memory module 100 will drop. Thus, an ordinary flash memory module performs a process (wear leveling) for equalizing the deterioration of the respective areas of the FM chips mounted in the ordinary flash memory module. The index generally used to show deterioration is the number of erases in each area. However, the reliability of the FM chip does not rely on the number of erases alone, and, for example, will also change in accordance with the rewrite interval and the temperature.

For the purpose of equalizing the deterioration of areas generated in accordance with such diverse factors, in Example 2, wear leveling is performed using the degree of deterioration computed in the refresh necessity determination process rather than the number of erases. An example in which wear leveling is performed using only the degree of deterioration computed in the refresh necessity determination process is described in Example 2, but wear leveling may be performed by combining the degree of deterioration with the number of erases.

The wear leveling in Example 2 is executed using the degree of deterioration stored in the degree of deterioration column 1108, which is stored in the block management table 1100. In Example 2, it is supposed that a fixed amount of erased PBA Groups are registered in an erased PBA Group pool. When the PBA Groups registered in the erased PBA Group pool is equal to or smaller than a given number, a so-called reclamation is performed to create an erased PBA Group.

In Example 2, in a case where a new erased PBA Group must be allocated as a data recording destination with respect to a write request from the higher-level apparatus 101, the processor 115 searches the erased PBA Group pool for an erased PBA Group with a small degree of deterioration, and allocates this PBA Group as the data recording destination. At this time, the processor 115 references the block management table 1100, acquires the value (degree of deterioration) of the degree of deterioration column 1108 of the row corresponding an unwritten PBA Group registered in the erased PBA Group pool, and performs control so as to preferentially use a PBA Group for which this value is relatively low as the data recording destination. In Example 2, the degree of deterioration of the degree of deterioration column 1108 is equalized for all the PBA Groups of the flash memory module 100 in accordance with this control. That is, the degree of deterioration, which is the index showing the amount of voltage drop in a PBA Group cell per unit of time, can be equalized among the respective PBA Groups, and as a result, equalization, which is more appropriately suited to the actual state of a cell than in the case of equalization performed using simply the number of erases, is possible.

(2-4) Management Screen

The flash memory module 100 related to Example 2 comprises a function for communicating internal management information to the higher-level apparatus 101. The higher-level apparatus 101 (for example, a server, a storage system, or the like) displays a management screen created on the basis of flash memory module 100 management information on a display coupled to the higher-level apparatus 101. The management screen may be displayed on a management apparatus, which is a different apparatus than the higher-level apparatus 101, and which manages the flash memory module 100 (or a storage system (for example, the storage system on Example 3) comprising this module 100).

The flash memory module 100 related to Example 2 also comprises a function, which enables various internal control thresholds to be configured from the higher-level apparatus 101. The higher-level apparatus 101 transfers each control threshold to the flash memory module 100 in a case where the administrator has inputted the various control thresholds via a management screen or a console.

Figure 15:
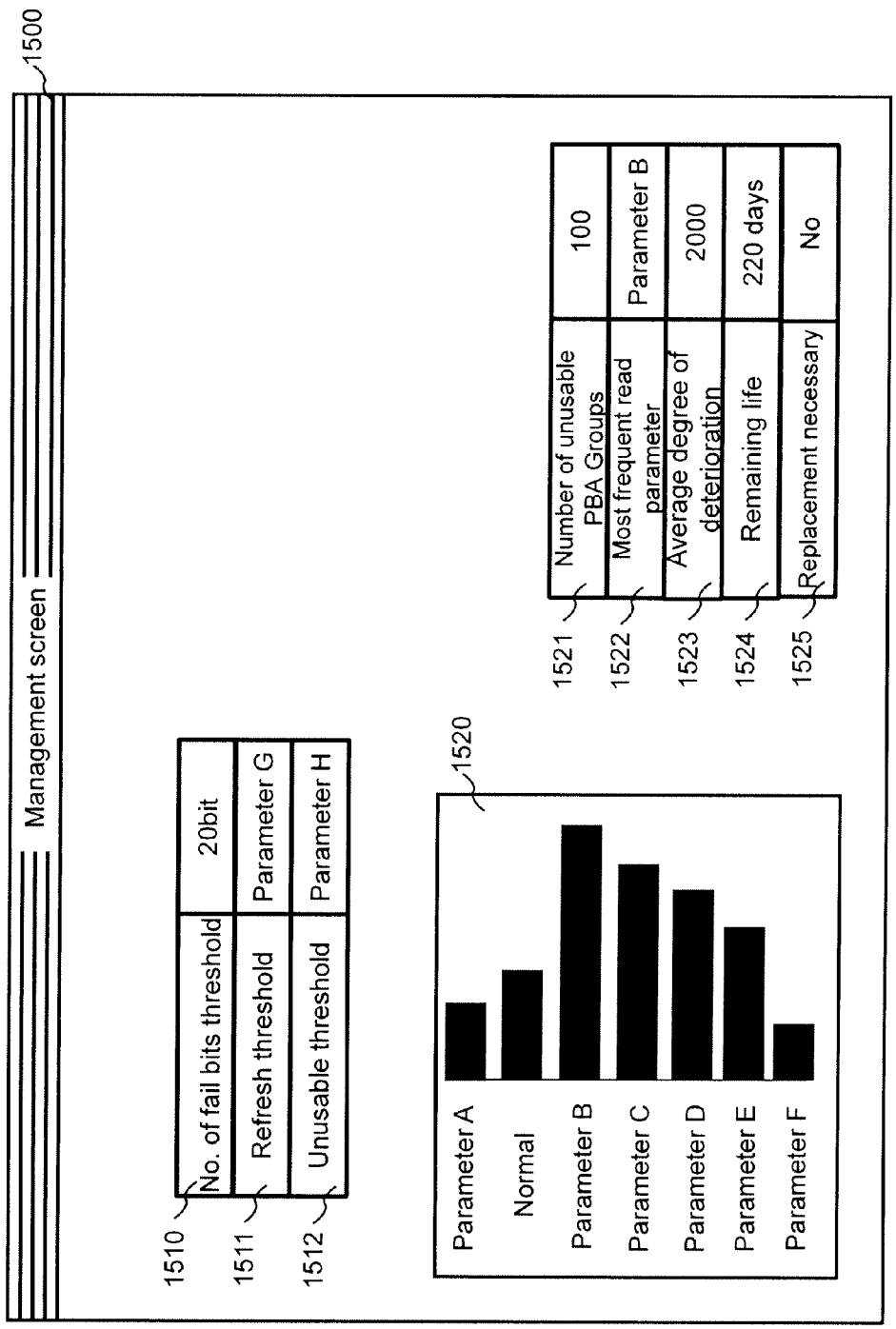
FIG. 15 is a diagram showing an example of a management screen related to Example 2.

FIG. 15 is a diagram showing an example of a management screen related to Example 2.

The management screen 1500 is displayed on a display, which is coupled to the higher-level apparatus 101 (a server, storage system, or the like) coupled to the flash memory module 100.

The management screen 1500 comprises input fields 1510 through 1512, and display fields 1520 through 1525.

The input field 1510 is for configuring and inputting a threshold (number of fail bits threshold), which is used in Step S1304 of the read parameter check and update process shown in FIG. 13. The administrator, in accordance with adjusting a threshold inputted into the input field 1510, can change the threshold constituting criteria for determining the suitability of a read parameter, and can configure the appropriateness of the read parameter. The smaller this threshold is, the more time is required to search for an appropriate read parameter, but this threshold is effective in that it makes it possible to reduce the number of fail bits included in data at the time of a read.

The input field 1511 is for configuring and inputting a threshold (the refresh threshold), which is used in Step S1403 of the refresh necessity determination process shown in FIG. 14. The administrator can change the criteria for executing a refresh and can adjust and control the tradeoffs with respect to performance and reliability in accordance with adjusting the threshold inputted into the input field 1511. More specifically, tightening the criteria for executing the refresh results in a PBA Group refresh being performed when a very slight fluctuation occurs in the cell state, making it possible to lower the probability of losing data, but at the same time, refreshes are performed frequently, lowering the operating performance of the flash memory module 100.

The input field 1512 is for configuring and inputting a threshold (the unusable threshold) for stipulating a read parameter, which does not allow utilization at the time of a read from an FM chip in the flash memory module 100. In Example 2, it is supposed that a PBA Group for which the read parameter has fallen below the unusable threshold even one time is unusable thereafter. The administrator can control the tradeoffs with respect to the reliability and device life of the flash memory module 100 in accordance with configuring a threshold for inputting to the input field 1512. More specifically, tightening this unusable threshold results in a determination that a PBA Group is unusable even when a slight change occurs in the cell state, and since only a PBA Group having good performance is used in the flash memory module 100, it is possible to lower the probability of losing data, but at the same time, most of the PBA Groups will be regarded as unusable, and as such, the amount of data capable of being written to the flash memory module 100 will decrease, shortening the life of the flash memory module 100.

The display field 1520 displays a read parameter distribution diagram, which shows the read parameter percentages for all the PBA Groups in the flash memory module 100. The administrator can estimate the deterioration of the flash memory module 100 in accordance with the mode of this distribution diagram.

The display field 1521 displays the number of PBA Groups, for which the read parameter has changed for the worse causing the flash memory module 100 to regard these PBA Groups as unusable (number of unusable PBA Groups). The administrator can determine the appropriateness of the value of the unusable threshold in the input field 1512 in accordance with the number displayed in this display field 1521.

The display field 1522 displays a read parameter, which occurs most frequently from among the read parameters of all the PBA Groups in the flash memory module 100 (most frequent read parameter). The administrator can estimate the operating status of the flash memory module 100 in accordance with the value displayed in the display field 1522.

The display field 1523 displays an average value of the degrees of deterioration of all the PBA Groups in the flash memory module 100 (average degree of deterioration). The display field 1523 displays an average degree of deterioration obtained in accordance with the processor 115 referencing the block management table 1100, adding together the degrees of deterioration of the degree of deterioration columns 1108 for each PBA Group, and dividing by the total number of PBA Groups. The administrator can estimate the deterioration of the flash memory module 100 in accordance with knowing the average degree of deterioration of the display field 1523.

The display field 1524 displays the remaining life of the flash memory module 100. To display the remaining life in the display field 1524, the processor 115 of the flash memory module 100 computes the amount of change in the average degree of deterioration per unit of time, and based on this amount of change in the average degree of deterioration, computes the remaining time (remaining life) until the degree of deterioration reaches an upper-limit value, and notifies this remaining life to the higher-level apparatus 101.

The display field 1525 displays the necessity of replacing the flash memory module 100 predicted in accordance with the internal read parameter distribution. For example, the processor 115, in a case where the read parameter distribution is distributed more than expected, determines that the reliability of the flash memory module 100 is in danger, and notifies the higher-level apparatus 101 to display "needed" in the display field 1525. In Example 2, in a case where a determination has been made that the reliability of the flash memory module 100 is in danger, the processor 115 causes the LED 118 coupled to the flash memory controller 110 to turn on. This, for example, makes it possible to easily identify, in accordance with the lighting status of the LED 118, a flash memory module 100, which needs to be replaced due to the danger posed to apparatus operation from the standpoint of reliability in a storage system constructed from multiple flash memory modules 100.

Example 3

Figure 20:
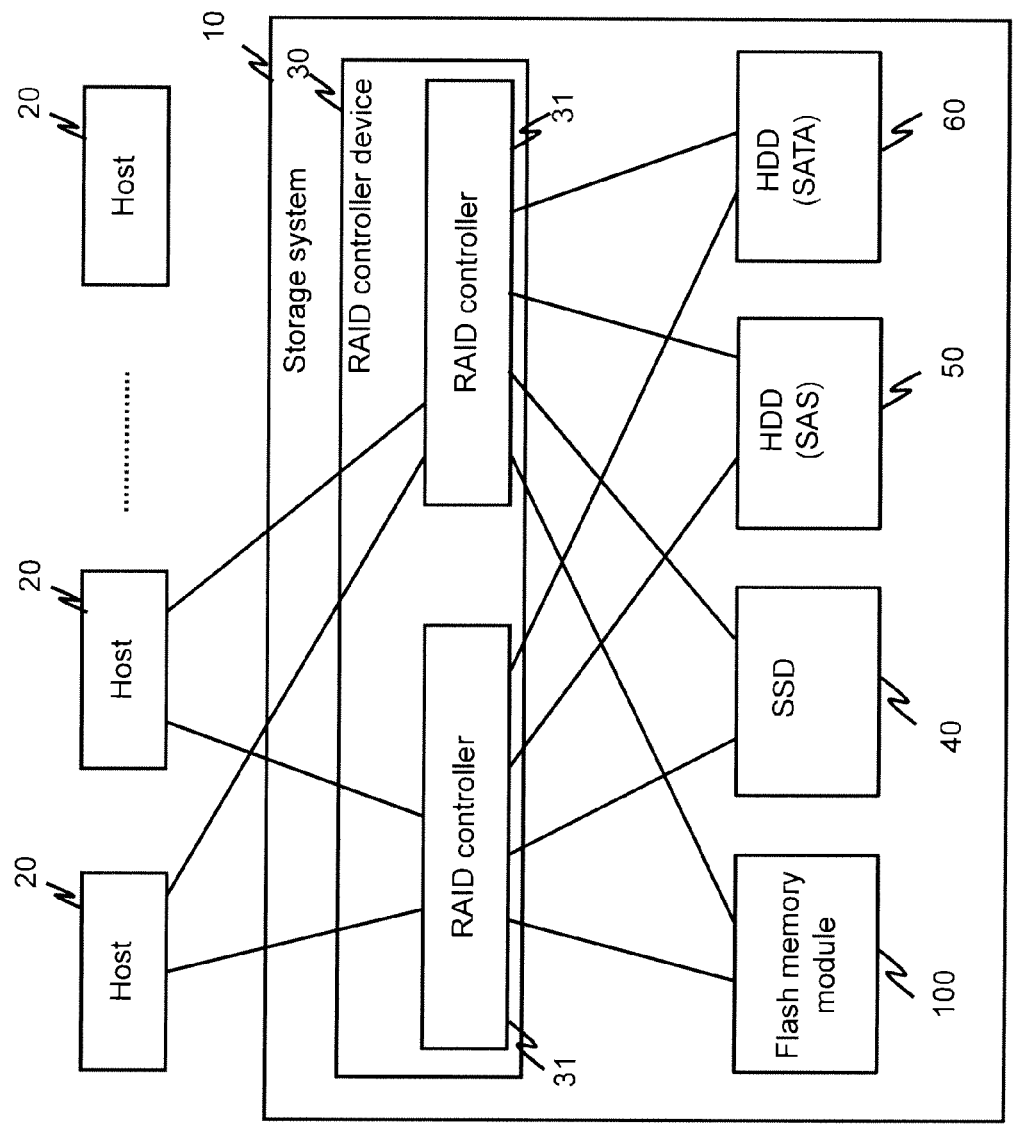
FIG. 20 is a detailed block diagram showing an example of a computer system related to Example 3.

FIG. 20 is detailed block diagram showing an example of a computer system related to Example 3.

The computer system comprises a storage system 10 and a host computer (host) 20. There can be one or more storage systems 10 and hosts 20, respectively. The storage system 10 and the host 20 are coupled to one another via a communication network (for example, a SAN (Storage Area Network)). The storage system 10 stores data, which is used in the host 20. The host 20 executes various processes, reads data from the storage system 10, and writes data to the storage system 10.

The storage system 10 comprises multiple storage devices, and a RAID (abbreviation for a Redundant Array of Independent (or Inexpensive) Disks) controller device 30, which is coupled to the multiple storage devices.

The multiple storage devices comprise multiple types of storage devices. One or more of at least one type of storage device may exist. As the storage devices, for example, there are a flash memory module 100, an SSD 40, a HDD (SAS: Serial Attached SCSI) 50 and a HDD (SATA: Serial ATA) 60.

The RAID controller device 30 comprises multiple RAID controllers 31. Each RAID controller 31 is coupled to a flash memory module 100, a SSD 40, a HDD (SAS) 50 and a HDD (SATA) 60 by way on an internal bus.

The RAID controller 31 is an example of a higher-level apparatus for the flash memory module 100, the SSD 40, the HDD (SAS) 50 and the HDD (SATA) 60. The RAID controller 31 receives an I/O command from a higher-level apparatus (for example, a host 20) of the RAID controller 31, and, in accordance with this I/O command, performs access control with respect to the flash memory module 100, the SSD 40, the HDD (SAS) 50, or the HDD (SATA) 60. The RAID controller 31 may perform processing for managing the respective storage areas of the flash memory module 100, the SSD 40, the HDD (SAS) 50, and the HDD (SATA) 60 as respectively different storage hierarchies, and allocating a storage area of any of the storage hierarchies to a logical area, which is a data write destination.

It is supposed here that the SSD 40 is capable of writing to the FM chip more times than the flash memory module 100, and, alternatively, that the flash memory module 100 is superior to the SSD 40 from the standpoints of reading speed and cost. For this reason, the RAID controller 31 may store relatively frequently read data in the flash memory module 100, and may stored relatively frequently written data in the SSD 40.

A number of examples have been explained hereinabove, but the present invention is not limited to these examples, and can be applied in various other modes.

For example, the same processing as that of the read parameter check and update process shown in FIG. 13 of Example 2 may be performed in the flash memory module 100 related to Example 1 described above. That is, a read parameter, which is suitable for a read process with respect to each block, may be searched for at a point in time that differs from that of a read request from the higher-level apparatus 101, and the read parameter management table 800 may be updated on the basis of the read parameter found as a result of this search.

In the read parameter check and update process of Example 2 described above, the read parameter is checked by targeting all of the blocks of the flash memory module 100, but, for example, the check may be performed by targeting only a portion of the range of blocks. In addition to being able to expect to achieve the same effects as described hereinabove for the range of blocks subjected to the check, it is also possible to expect that the processing load in accordance with the read parameter check and update process will be reduced.

In the read parameter check and update process shown in FIG. 13 of Example 2 described above, the processing corresponding to Steps S1003 through Step S1006 of the read parameter search process shown in FIG. 10 of Example 1 may be executed instead of Step S1306, a peculiar block may be determined, and the peculiar block may be regarded as unusable.

REFERENCE SIGNS LIST

10 Storage system
100 Flash memory module
110 Flash memory controller
115 Processor
116 Data buffer
117 Flash memory interface
120 FM chip
202 Block
301 Page
402 ECC-appended code
500 Address translation table
600 Block management table
700 Ambient temperature management table
800 Read parameter management table

The invention claimed is:

1. A semiconductor storage device, comprising:
a nonvolatile semiconductor memory comprising a plurality of storage areas; and
a controller which is coupled to the nonvolatile semiconductor memory,
wherein the controller is configured to manage degree of deterioration for each of storage areas, the degree of deterioration is based on a number of error bits of data which is written in a storage area of the plurality of storage areas, wherein the controller is configured to manage read parameter information including one or more read parameters relevant to the degree of deterioration, wherein the controller is configured to specify a first read parameter including a value of a voltage applied to a cell corresponding to a first storage area of the plurality of storage areas, based on (1) a first number of error bits of data which is written in the first storage area and (2) the read parameter information, wherein the controller is configured to read data from the first storage area by using the first read parameter, and wherein the first read parameter is a value of a voltage applied to a cell corresponding to the first storage area in order to read data from the first storage area.

2. The semiconductor storage device according to claim 1, wherein each of the plurality of storage areas is configured with at least one of one or more cells in a chip of the nonvolatile semiconductor memory, and wherein the read parameter information includes at least one of the following (x) through (z):

(x) a voltage value of a read voltage supplied to a target word line of the one or more cells corresponding to a read target storage area;

(y) a read time for waiting for a measurement of the voltage value of the read voltage; and (z) a voltage value of a pass voltage supplied to other word lines of the one or more cells corresponding to a read target storage area and information for identifying the other word lines.

3. The semiconductor storage device according to claim 1, wherein the controller is configured to specify the first read parameter responsive to receiving a read request to the first storage area from an external device.

4. The semiconductor storage device according to claim 1, wherein the controller is configured to specify the first read parameter before receiving a read request to the first storage area from an external device.

5. The semiconductor storage device according to claim 1, wherein the voltage value as the first read parameter is a voltage value reduced from a voltage value which is included in the read parameter information and has been previously used to read data.

6. A semiconductor storage device, comprising:
a nonvolatile semiconductor memory comprising a plurality of storage areas; and
a controller which is coupled to the nonvolatile semiconductor memory,
wherein the controller is configured to manage degree of deterioration for each of storage areas, the degree of deterioration is based on an elapsed time after data is written to a storage area of the plurality of storage areas and a number of error bits of data which is written in the storage area of the plurality of storage areas,
wherein the controller is configured to manage read parameter information including one or more read parameters relevant to the degree of deterioration,
wherein the controller is configured to specify a first read parameter including a value of a voltage applied to a cell corresponding to a first storage area of the plurality of storage areas, based on (1) a first number of error bits of data which is written in the first storage area and (2) the read parameter information,
wherein the controller is configured to read data from the first storage area by using the first read parameter, wherein the first read parameter is a value of a voltage applied to a cell corresponding to the first storage area in order to read data from the first storage area, and wherein the degree of deterioration is further based on an ambient temperature of each of the storage areas, wherein the read parameter information is configured to manage the one or more read parameters for the storage areas at a standard temperature, wherein the controller is configured to convert the elapsed time after the data is written to the storage area at the ambient temperature into an adjusted elapsed time at the standard temperature, and wherein the controller is configured to specify the first read parameter by using the adjusted elapsed time.

7. The semiconductor storage device according to claim 6, wherein each of the plurality of storage areas is configured with at least one of one or more cells in a chip of the nonvolatile semiconductor memory, and wherein the read parameter information includes at least one of the following (x) through (z):

(x) a voltage value of a read voltage supplied to a target word line of the one or more cells corresponding to a read target storage area;

(y) a read time for waiting for a measurement of the voltage value of the read voltage; and (z) a voltage value of a pass voltage supplied to other word lines of the one or more cells corresponding to a read target storage area and information for identifying the other word lines.

8. The semiconductor storage device according to claim 6, wherein the controller is configured to specify the first read parameter responsive to receiving a read request to the first storage area from an external device.

9. The semiconductor storage device according to claim 6, wherein the controller is configured to specify the first read parameter before receiving a read request to the first storage area from an external device.

10. A semiconductor storage device, comprising:
a nonvolatile semiconductor memory comprising a plurality of storage areas; and
a controller which is coupled to the nonvolatile semiconductor memory,
wherein the controller is configured to manage degree of deterioration for each of storage areas, the degree of deterioration is based on a number of error bits of data which is written in a storage area of the plurality of storage areas,
wherein the controller is configured to manage read parameter information including one or more read parameters relevant to the degree of deterioration,
wherein the controller is configured to specify a first read parameter corresponding to a first storage area of the plurality of storage areas, based on the degree of deterioration corresponding to the first storage area and the read parameter information,
wherein the controller is configured to read data from the first storage area by using the first read parameter, and
wherein the first read parameter is a value of a voltage applied to a cell in order to read data,
wherein the degree of deterioration is further based on an ambient temperature of each of the storage areas,
wherein the read parameter information is configured to manage the one or more read parameters for the storage areas at a standard temperature,
wherein the controller is configured to convert an elapsed time after the data is written to the storage area at the ambient temperature into an adjusted elapsed time at the standard temperature, and wherein the controller is configured to specify the first read parameter by using the adjusted elapsed time.

* * * * *